(12) United States Patent
Chevallier et al.

(10) Patent No.: US 8,705,260 B2
(45) Date of Patent: *Apr. 22, 2014

(54) CIRCUITS AND TECHNIQUES TO COMPENSATE DATA SIGNALS FOR VARIATIONS OF PARAMETERS AFFECTING MEMORY CELLS IN CROSS POINT ARRAYS

(71) Applicant: Unity Semiconductor Corporation, Sunnyvale, CA (US)

(72) Inventors: Christophe Chevallier, Palo Alto, CA (US); Seow Fong Lim, Fremont, CA (US); Chang Hua Siau, Saratoga, CA (US)

(73) Assignee: Unity Semiconductor Corporation, Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/728,676

(22) Filed: Dec. 27, 2012

(65) Prior Publication Data

US 2013/0215667 A1 Aug. 22, 2013

Related U.S. Application Data

(63) Continuation of application No. 12/931,422, filed on Jan. 31, 2011, now Pat. No. 8,363,443.

(60) Provisional application No. 61/337,706, filed on Feb. 3, 2010, provisional application No. 61/337,299, filed on Feb. 1, 2010.

(51) Int. Cl.
*G11C 5/02* (2006.01)
*G11C 11/21* (2006.01)

(52) U.S. Cl.
USPC ............. 365/51; 365/130; 365/148; 365/163; 365/185.33; 365/211

(58) Field of Classification Search
USPC ........................................................ 365/130
See application file for complete search history.

(56) References Cited

U.S. PATENT DOCUMENTS 6,836,421 B2 12/2004 Rinerson et al.
6,859,382 B2 2/2005 Rinerson et al.
(Continued)

OTHER PUBLICATIONS

Chevallier, Christophe, et al., U.S. Appl. No. 12/657,895, filed Jan. 29, 2010, re Filed Application with Figures. 41 pages.

(Continued)

*Primary Examiner* — Tan T. Nguyen
(74) *Attorney, Agent, or Firm* — Stolowitz Ford Cowger LLP

(57) ABSTRACT

Embodiments of the invention relate generally to semiconductors and memory technology, and more particularly, to systems, integrated circuits, and methods to implement circuits configured to compensate for parameter variations that affect the operation of memory elements, such as memory elements based on third dimensional memory technology. In at least some embodiments, an integrated circuit includes a cross-point array comprising memory elements disposed among word lines and bit lines, where a parameter can affect the operating characteristics of a memory element. The integrated circuit further includes a data signal adjuster configured to modify the operating characteristic to compensate for a deviation from a target value for the operating characteristic based on the parameter. In some embodiments, the memory element, such as a resistive memory element, is configured to generate a data signal having a magnitude substantially at the target value independent of variation in the parameter.

20 Claims, 14 Drawing Sheets

(56) References Cited

U.S. PATENT DOCUMENTS

| | | |
|---|---|---|
| 6,970,391 B2 | 11/2005 | Watanabe et al. |
| 6,999,339 B2 | 2/2006 | Tuttle et al. |
| 7,009,909 B2 | 3/2006 | Rinerson et al. |
| 7,057,914 B2 | 6/2006 | Rinerson et al. |
| 7,079,442 B2 | 7/2006 | Rinerson et al. |
| 7,149,107 B2 | 12/2006 | Rinerson et al. |
| 7,227,774 B2 | 6/2007 | Tuttle et al. |
| 7,227,775 B2 | 6/2007 | Rinerson et al. |
| 7,327,753 B2 | 2/2008 | Raissinia et al. |
| 7,379,364 B2 | 5/2008 | Siau et al. |
| 7,508,695 B2 | 3/2009 | Sugita |
| 7,538,338 B2 | 5/2009 | Rinerson et al. |
| 7,701,791 B2 | 4/2010 | Rinerson et al. |
| 7,719,876 B2 | 5/2010 | Chevallier et al. |
| 7,796,451 B2 | 9/2010 | Norman |
| 7,830,701 B2 | 11/2010 | Siau et al. |
| 7,884,349 B2 | 2/2011 | Rinerson et al. |
| 7,897,951 B2 | 3/2011 | Rinerson et al. |
| 8,040,723 B2 * | 10/2011 | Sheu et al. .............. 365/163 |
| 8,050,084 B2 * | 11/2011 | Bae et al. ............... 365/163 |
| 8,064,256 B2 | 11/2011 | Norman |
| 8,134,866 B2 * | 3/2012 | Bae et al. ............... 365/163 |
| 8,139,409 B2 | 3/2012 | Chevallier et al. |
| 8,164,937 B2 | 4/2012 | Norman |
| 8,164,970 B2 | 4/2012 | Norman |
| 8,270,193 B2 | 9/2012 | Siau et al. |
| 2006/0171200 A1 | 8/2006 | Rinerson et al. |
| 2009/0027976 A1 | 1/2009 | Rinerson et al. |
| 2009/0154232 A1 | 6/2009 | Norman |
| 2010/0157647 A1 | 6/2010 | Rinerson et al. |
| 2010/0157670 A1 | 6/2010 | Chevallier et al. |
| 2010/0159641 A1 | 6/2010 | Rinerson et al. |
| 2010/0159688 A1 | 6/2010 | Rinerson et al. |
| 2010/0232240 A1 | 9/2010 | Norman |
| 2010/0290294 A1 | 11/2010 | Siau |
| 2011/0188281 A1 | 8/2011 | Siau et al. |
| 2011/0188282 A1 | 8/2011 | Chevallier et al. |
| 2011/0188283 A1 | 8/2011 | Chevallier et al. |
| 2011/0188284 A1 | 8/2011 | Chevallier et al. |

OTHER PUBLICATIONS

Chevallier, Christophe, et al., U.S. Appl. No. 12/658,138, filed Feb. 2, 2010, re Filed Application with Figures. 34 pages.

Chevallier, Christophe, et al., U.S. Appl. No. 12/931,422, filed Jan. 31, 2011, re Filed Application and Figures. 51 pages.

Chevallier, Christophe, et al., U.S. Appl. No. 12/931,438, filed Feb. 1, 2011, re Filed Application with Figures. 34 pages.

Siau, Chang Hua, et al., U.S. Appl. No. 12/657,911, filed Jan. 29, 2010, re Filed Application with Figures. 54 pages.

* cited by examiner

US 8,705,260 B2

CIRCUITS AND TECHNIQUES TO COMPENSATE DATA SIGNALS FOR VARIATIONS OF PARAMETERS AFFECTING MEMORY CELLS IN CROSS POINT ARRAYS

CROSS-REFERENCE TO RELATED APPLICATIONS

This application is a continuation of and claims priority to U.S. patent application Ser. No. 12/931,422, filed Jan. 31, 2011, now issued as U.S. Pat. No. 8,363,443, which is a non-provisional of and claims priority to U.S. provisional patent application, 61/337,706, filed Feb. 3, 2010, and U.S. provisional patent application 61/337,299, filed Feb. 1, 2010, all of which are incorporated herein by reference in their entirety. This application is related to U.S. patent application Ser. No. 11/095,026, filed Mar. 30, 2005, published as U.S. Pub. No. 2006/0171200, and entitled "Memory Using Mixed Valence Conductive Oxides," which is incorporated herein by reference.

FIELD OF THE INVENTION

The present invention relates generally to microelectronics and more specifically to non-Flash re-writable non-volatile memory and integrated circuits for controlling data operations on non-Flash re-writable non-volatile memory.

BACKGROUND

Variations in temperature and process may influence the operation of traditional memory technologies implemented in conventional memory architectures. Such variations generally affect the reliability of memory devices. Some conventional memory architectures include circuitry to improve the reliability of memory devices over fluctuations in temperature and process. One approach uses a transistor device as a thermometer and a feedback circuit to change operation of memory cells, such as transistor or gated-based memories (e.g., DRAM, Flash, etc.), for the purposes of addressing the effects of temperature changes. While such circuitry is functional, the conventional techniques of reducing the effects of temperature and process variations are not well suited for other memory technologies.

There are continuing efforts to improve memory architectures to compensate for parameter variations that affect the operation of memory elements in cross-point memory architectures.

BRIEF DESCRIPTION OF THE DRAWINGS

The various embodiments are more fully appreciated in connection with the following detailed description taken in conjunction with the accompanying drawings, in which.

Figure 1:
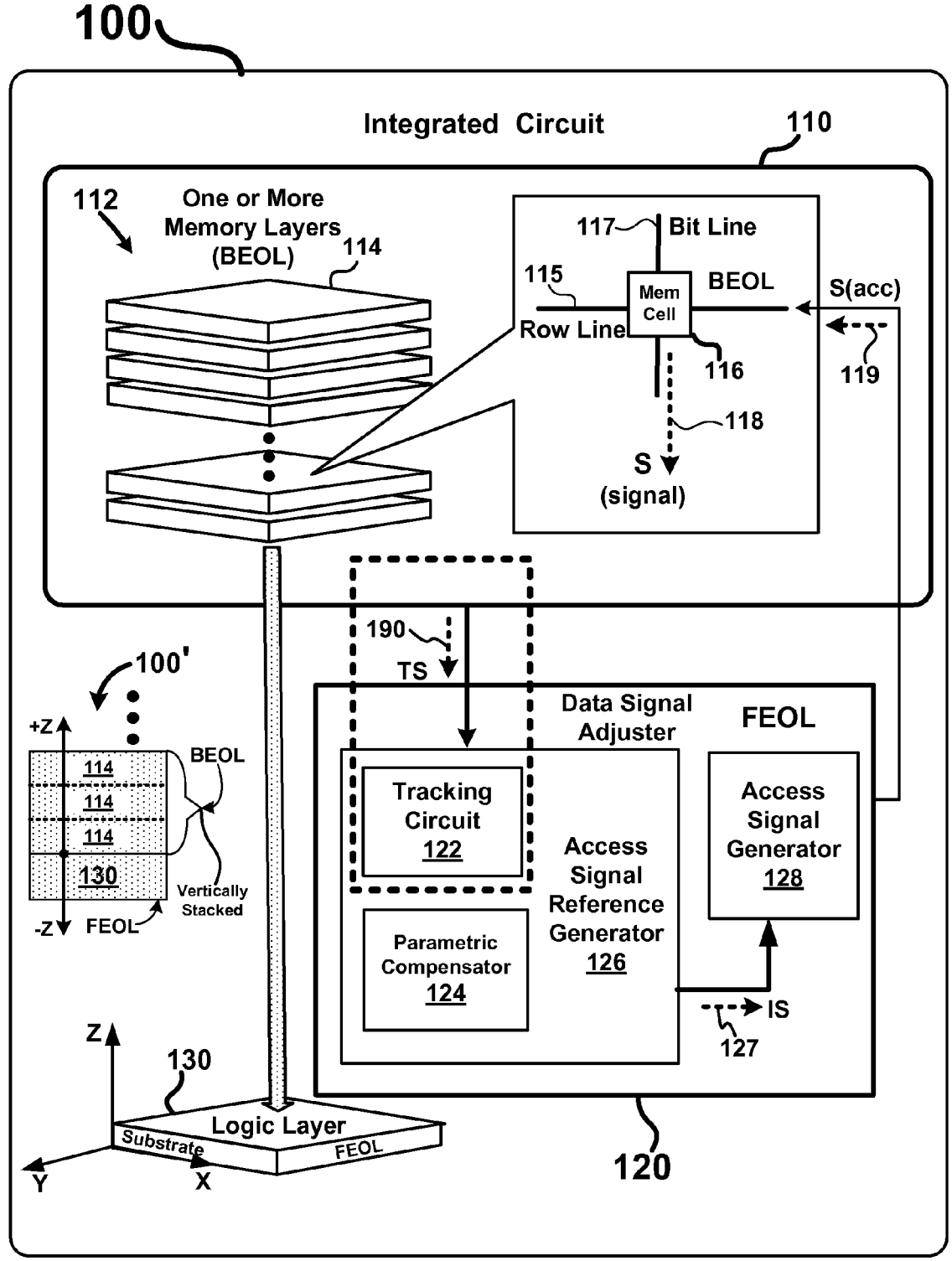
FIG. 1 illustrates an example of an integrated circuit including memory and a data signal adjuster in accordance with various embodiments.

Like reference numerals refer to corresponding parts throughout the several views of the drawings. Note that most of the reference numerals include one or two left-most digits that generally identify the figure that first introduces that reference number. Although the previous Drawings depict various examples of the invention, the invention is not limited to those specific examples. Furthermore, the depictions are not necessarily to scale.

DETAILED DESCRIPTION

Various embodiments or examples of the invention may be implemented in numerous ways, including as a system, a process, an apparatus, or a series of program instructions on a computer readable medium such as a computer readable storage medium or a computer network where the program instructions are sent over optical, electronic, or wireless communication links. In general, operations of disclosed processes may be performed in an arbitrary order, unless otherwise provided in the claims.

A detailed description of one or more examples is provided below along with accompanying figures. The detailed description is provided in connection with such examples, but is not limited to any particular example. The scope is limited only by the claims, and numerous alternatives, modifications, and equivalents are encompassed. Numerous specific details are set forth in the following description in order to provide a thorough understanding. These details are provided as examples and the described techniques may be practiced according to the claims without some or all of the accompanying details. For clarity, technical material that is known in the technical fields related to the examples has not been described in detail to avoid unnecessarily obscuring the description.

U.S. patent application Ser. No. 11/095,026, filed Mar. 30, 2005, published as U.S. Pub. No. 2006/0171200, and entitled "Memory Using Mixed Valence Conductive Oxides," is hereby incorporated by reference in its entirety for all purposes and describes non-volatile third dimensional memory elements that may be arranged in a two-terminal cross-point memory array. New non-volatile memory structures are possible with the capability of this third dimensional memory array. In at least some embodiments, a two-terminal memory element or memory cell can be configured to change conductivity when exposed to an appropriate voltage drop across its two-terminals. The memory element can include an electrolytic tunnel barrier in contact with and electrically in series with a mixed valence conductive oxide that includes mobile oxygen ions in some embodiments, as well as multiple layers of mixed valence conductive oxide structures in other embodiments. The electrolytic tunnel barrier comprises an electronically insulating material that is thin enough to promote electron tunneling during data operations on the memory element (e.g., read and write operations) while also promoting a high electric field during write operations operable to cause the mobile oxygen ions to be transported into or out of the electrolytic tunnel barrier depending on the direction of the electric field within the memory element. The direction of the electric field is determined by the polarity of the write voltage. Therefore, the electrolytic tunnel barrier is permeable to the mobile oxygen ions and is operative as an electrolyte to the mobile oxygen ions. The mobile oxygen ions are transported between the electrolytic tunnel barrier and the mixed valence conductive oxide in response to an electric field generated by the application of the write voltage across the electrolytic tunnel barrier and the mixed valence conductive oxide. Examples of conductive metal oxides suitable for use as the mixed valence conductive oxide includes but is not limited to perovskites and binary oxides (e.g., a conductive binary oxide). Application of a write voltage across the memory element is operative to create a voltage drop across the electrolytic tunnel barrier that generates a higher electric field within the electrolytic tunnel barrier that is operative to transport a portion of the mobile oxygen ions in the mixed valence conductive oxide into the electrolytic tunnel barrier for a first polarity of the write voltage and to transport the portion of portion of the mobile oxygen ions in the electrolytic tunnel barrier back into the mixed valence conductive oxide for a second polarity of the write voltage, the second polarity is opposite the first polarity.

In some embodiments, an electrolytic tunnel barrier and one or more mixed valence conductive oxide structures do not need to operate in a silicon substrate (e.g, a silicon die or silicon wafer), and, therefore, can be fabricated back-end-of-the-line (BEOL) directly above circuitry fabricated front-end-of-the-line (FEOL) on the semiconductor substrate and being used for other purposes. Further, a two-terminal memory element can be configured in a cross-point such that one terminal of the memory element is electrically coupled with an X-direction line (or an "X-line") and the other terminal of the memory element is electrically coupled with a Y-direction line (or a "Y-line"). A discrete two-terminal memory element is one in which the two terminals of the memory element are directly electrically coupled with the conductive array lines (e.g., X-line and Y-line or a Word-line and Bit-line) at its respective cross-point without any intervening structure such as a selection device, also known as a non-ohmic device (NOD). Therefore, a discrete two-terminal memory element is one that is directly electrically in series with its respective conductive array lines. Examples of a selection devices/NOD include metal-insulator-metal (MIM) devices or one or more diodes that comprise an intervening structure that is electrically in series with the memory element and with the conductive array lines. Unless otherwise specified herein, all references to a memory element or memory cell is a reference to a discrete memory element or discrete memory cell that does not include a selection device or NOD. A third dimensional memory can include multiple memory layers that are vertically stacked upon one another, with memory elements in a memory layer that sometimes share X-direction and Y-direction lines with memory elements in adjacent memory layers. In other embodiments, the memory elements in each memory layer have electrically isolated conductive array lines and do not share conductive array lines with memory elements in adjacent memory layers. When a first write voltage, VW1, is applied across the memory element (e.g., by applying ½VW1 to the X-direction line and ½-VW1 to the Y-direction line), the memory element can switch to a low resistive state. When a second write voltage, VW2, is applied across the memory element (e.g., by applying ½ VW2 to the X-direction line and ½-VW2 to the Y-direction line), the memory element can switch to a high resistive state. Memory elements using electrolytic tunnel barriers and mixed valence conductive oxides can have VW1 opposite in polarity from VW2.

FIG. 1 depicts an example of an integrated circuit including memory and a data signal adjuster in accordance with various embodiments. In this example, integrated circuit 100 includes a memory 110, a logic layer 130 including active circuitry fabricated FEOL on a semiconductor substrate (e.g., a silicon die or silicon wafer), and a data signal adjuster 120 having portions disposed in either memory 110 or logic layer 130, or both. Memory 110 includes an arrangement 112 of one or more memory layers 114 (or layers 114 of memory) that are formed BEOL above some or all of logic layer 130. Although memory layers 114 are depicted as being separate from one another for purposes of explanation, memory layers 114 are in contact with one another and are vertically stacked above and in contact with the logic layer 130 to form a unitary whole (e.g., a single die) for an integrated circuit as depicted for integrated circuit 100' as will be described in greater detail below in regards to FIG. 11. Data signal adjuster 120 includes an access signal reference generator 126 and an access signal generator 128. Access signal reference generator 126 is configured to characterize the effect of a parameter on memory cell 116 and to compensate for the parameter. In one embodiment, memory cell 116 is coupled to a row line 115 and a bit line 117. In some embodiments, access signal reference generator 126 is configured to receive a tracking signal ("TS") 190 with which to characterize variations in a signal ("S") 118. Further, access signal reference generator 126 is configured to generate an intermediate signal ("IS") 127 having a magnitude approximating and/or indicating the degree to which a variation in the parameter affects signal 118. In some embodiments, intermediate signal 127 can specify an amount by which to modify signal 118. Access signal generator 128 receives intermediate signal 127 and generates access signal ("S(acc)") 119 as a function of intermediate signal 127 to stabilize signal 118 at or near a target value.

Memory layers 114 include arrays of memory cells, such as memory cell ("Mem Cell") 116, that operate subject to one or more parameters. These parameters can be any factor that determines a range of variation in the operation of memory cell 116. Examples of such parameters include temperature, operational signals (e.g., input voltage, such as Vcc), structural attributes or features, such as the size or thickness of a thin-film material, and the like. In some applications the thin film material can be a semiconductor material. In some embodiments, memory cell 116 includes two terminals (i.e., is a two-terminal memory cell) and includes a two-terminal resistive state memory element, such as the aforementioned discrete two-terminal memory element. Data signal adjuster 120 is configured to access memory cell 116 by applying an access signal 119 to terminal 115 of memory cell 116. Responsive to access signal 119, memory cell 116 can generate at another terminal 117 a signal ("S") 118, or data signal, having a magnitude indicative of data values stored therein. Examples of data values include but are not limited to a first resistive state indicative of a programmed value and a second resistive state indicative of an erased value. In some embodiments, cell 116 or its respective memory element can store exactly one bit of data (e.g., a SLC) and in other embodiments, cell 116 or its respective memory element can store more than one bit of data (e.g., a MLC). Data signal adjuster 120 can stabilize the magnitude of signal 118 to operate at a stabilized value (or a target value), or within a range including the stabilized value. A stabilized value facilitates accurate sensing of the data values stored in memory cell 116 over variations in parameters. Thus, data signal adjuster 120 is configured to compensate for variations in parameters that otherwise might affect the operation of memory cells 116 as well as the integrated circuit 100.

In view of the foregoing, the structures and/or functionalities of integrated circuit 100 can compensate for variations of parameters to stabilize signal 118, which, in turn, can reduce sensing-related errors due to such variations of parameters, according to various embodiments. In at least some embodiments, integrated circuit 100 implements one or more memory cells (i.e., tracking cells) composed of the same memory technology (e.g., materials and structure as the memory cell 116) to facilitate accurate characterization of varied parameters. To illustrate, consider that memory cells 116 store data values as non-linear values of resistance, which gives rise to a non-linear current-to-voltage relationship (e.g., a non-linear I-V characteristic). Other similarly-formed memory cells—as tracking cells—are used to facilitate the characterization of signal 118. Further, data signal adjuster 120 can compensate for the effects of a changing parameter (e.g., temperature) that varies over a range of parameter values (e.g., 0° C. to 85° C. or some other range of temperatures), whereby the changing parameter can vary the magnitude of signal 118 more than, for example, 100% at an otherwise fixed magnitude for access signal 119. In some cases, a parameter can cause the magnitude of signal 118 to vary by 20 to 30 times a target value for some types of memory cells 116. According to various embodiments, data signal adjuster 120 can stabilize signal 118 over a relatively wide range of magnitudes. In at least some embodiments, memory cells 116 can be conductive metal oxide ("CMO")-based memory cells. Such memory cells can provide for re-writeable non-volatile two-terminal memory elements that retain stored data in the absence of electrical power and data can be written to memory elements without having to perform a prior erase or block erase operation. In contrast, conventional non-volatile Flash memory use a Flash operating system (Flash OS) that implements an erase command or block erase command prior to a write operation. Moreover, the two-terminal cross-point array configuration as described herein, (i.e., requires no transistors or other active devices to address a memory cell for a data operation) allows for random access to memory element(s) in the cross-point array(s) at a granularity for data operations (e.g., read or write) as small as a single bit, a nibble, a byte, a word, a single page, multiple pages, a block, or multiple blocks, unlike conventional non-volatile Flash memory which requires operations on entire block(s) and does not allow a single bit of data to be randomly accessed for a data operation.

In some cases, values of a parameter can vary differently in each of layer 114 of memory. In some embodiments, each memory layer 114 can include different sub-layers of different thin-film materials. A parameter can vary differently relative to either other sub-layers in the same memory layer or other similar sub-layers in different memory layers. For example, a thickness of a sub-layer, as a parameter, can vary in a manner that can cause the magnitude of signal 118 to vary. Examples of such sub-layers include dielectric sub-layers, electrolytic insulator sub-layers (e.g., tunnel barrier sub-layers), conductive metal oxide sub-layers, ion barrier sub-layers, and sub-layers of other thin-film materials used to form memory cell 116. Data signal adjuster 120 can adjust signal 118 to stabilize its magnitude over different sub-layer thicknesses, as well as different thicknesses for different layers 114 of memory. In some embodiments, data signal adjuster 120 can characterize memory cell 116 in one layer 114 of memory differently than other memory cells in other layers 114 of memory. Thus, data signal adjuster 120 can generate multiple intermediate signals 127 each corresponding to a different layer 114 of memory. In at least some embodiments, integrated circuit 100 includes groups of tracking cells (not shown) disposed in different memory layers 114 of the memory 110. Thus, data signal adjuster 120 can characterize memory cells 116 in those different memory layers 114 differently as a function of the magnitudes of tracking signals 190 generated by the groups of tracking cells.

In some embodiments, the magnitudes of intermediate signals 127 can be less than the magnitudes of access signal 119 to reduce, for example, the effects of phenomena that can cause a "disturb." The term disturb generally refers to "disturb effects," such as the electrical and/or electromagnetic coupling (or otherwise) on neighboring memory elements or cells that are not selected for a data operation when other memory cells are selected for a data operation. A "disturb" can also refer to a scenario where a read operation to a memory element(s) results in a disturb to the memory element(s) being read by the read operation. For example, the application of a read voltage across the terminals of the memory element(s) results in the resistive state stored in the memory element(s) being altered. The alteration can be by a slight amount that results in an increase or decrease in a value of the conductivity profile (e.g., value of the resistive state) stored in the memory element(s). Over time, the accumulated effect of disturbs can result in the corruption of the data stored in the memory cell and sense circuitry may not be able to accurately determine the value (e.g., logic "0" or logic "1") of the corrupted data. In at least some embodiments, access signal generator 128 can include trim circuitry (not shown) configured to boost or increase the magnitude of intermediate signal 127 by an amount determined as a function of a programmable trim value. Examples of trim values relate to trim values associated with either a read operation, an erase verify (read) operation, or a program verify (read) operation. Trim values can also relate to write operations such as program and erase operations.

Access signal reference generator 126 includes a tracking circuit 122 that can include portions residing either in data signal adjuster 120 or memory 110, or both. For example, active circuitry fabricated FEOL in logic layer 130 can include a portion dedicated to tracking circuit 122; whereas, tracking cells and their respective tracking arrays can be co-fabricated BEOL in memory layers 114 of memory 110 as will be described in greater detail below. Also included in access signal reference generator 126 is a parametric compensator 124 configured to compensate for a parameter. In operation, a data signal adjuster 120 is configured to characterize a parameter associated with a value of signal 118 generated by memory cell 116. That is, data signal adjuster 120 can determine—either directly or indirectly—the degree of variation of a parameter, such as an amount of change in temperature or a change in thickness or material property of a thin film material (e.g., a conductive metal oxide layer(s), an electrolytic tunnel barrier layer, layers used for electrodes, barrier layers, adhesions layers, glue layers, and the like). Those thin film layers can vary from lot-to-lot, die-to-die, wafer-to-wafer, and layer-to-layer in a multi-layer vertically stacked memory. The degree of variation of a parameter can be determined by the effect of the variation in the parameter on one or more tracking cells and can be represented by the magnitude of tracking signal 190. In some instances, the magnitude of tracking signal 190 can predict the effect of the variation in the parameter on memory cell 116 to, for example, reduce or negate the effects of the parameter on signal 118. In some embodiments, a portion of tracking circuit 122 resides in memory 110 and generates tracking signal 190, which is received by parametric compensator 124. In turn, parametric compensator 124 can generate intermediate signal 127 as a function of the variation in the parameter (e.g., as characterized by the value of tracking signal 190). Next, data signal adjuster 120 can be configured to stabilize the magnitude of signal 118 at a stabilized value or a target value, thereby compensating for the variation in the parameter. In some examples, access signal generator 128 can generate an access signal for application via row line 115 to memory cell 116 to generate at bit line 117 a data value indicating a stabilized magnitude of signal 118. The magnitude of signal 118 then can be used to more accurately sense the data value at a sense amplifier circuit, according to some embodiments.

In at least some embodiments, layers 114 of memory can constitute a cross point memory array including X-lines and Y-lines. Note that the fabrication of bit lines can include fabricating Y-lines, and the fabrication of row lines can include fabricating X-lines. Memory elements 116 are formed between cross-points of the X-lines and the Y-lines. As used herein, the term "target value" or "target magnitude" can refer, at least in some embodiments, to a value, or range of values, at which a magnitude for a signal (e.g., a read current signal) provides reliable data values during a sensing operation or a write current signal produces reliable write data values during a write operation. As used herein, the term "stabilized value" can refer, at least in some embodiments, to a value or a magnitude of a signal (e.g., a read current signal or a write current signal) that has been modified to compensate for variations in parameters, whereby the modified magnitude of the signal is stable at or near a target magnitude. In some embodiments, the terms "target value" and "target magnitude" can be used interchangeably with the term "stabilized value." Note that while memory cell 116 can be a two-terminal memory cell, the various embodiments can apply to three-terminal memory cells, and, thus, the various embodiments are not limited to CMO-based memory elements or resistance-based memory elements and can be implemented with other memory technologies. As used herein, the terms memory cell and memory element can be used interchangeably. While layers 114 are shown as being parallel to an X-Y plane, layers 114 are not so limited and can be parallel to a Y-Z plane or an X-Z plane. Note that in some embodiments, an access signal generator 128, such as a read voltage generator, can be omitted, whereby intermediate signal 127 can be used as access signal 119. In other embodiments, an access signal generator, such as a write voltage generator (e.g., for generating program and erase voltages during write operations), controls application of write voltages applied across one or more memory elements based on a magnitude of a write current signal, as will be described in greater detail below in regards to FIG. 10A and FIG. 10B.

Figure 2A:
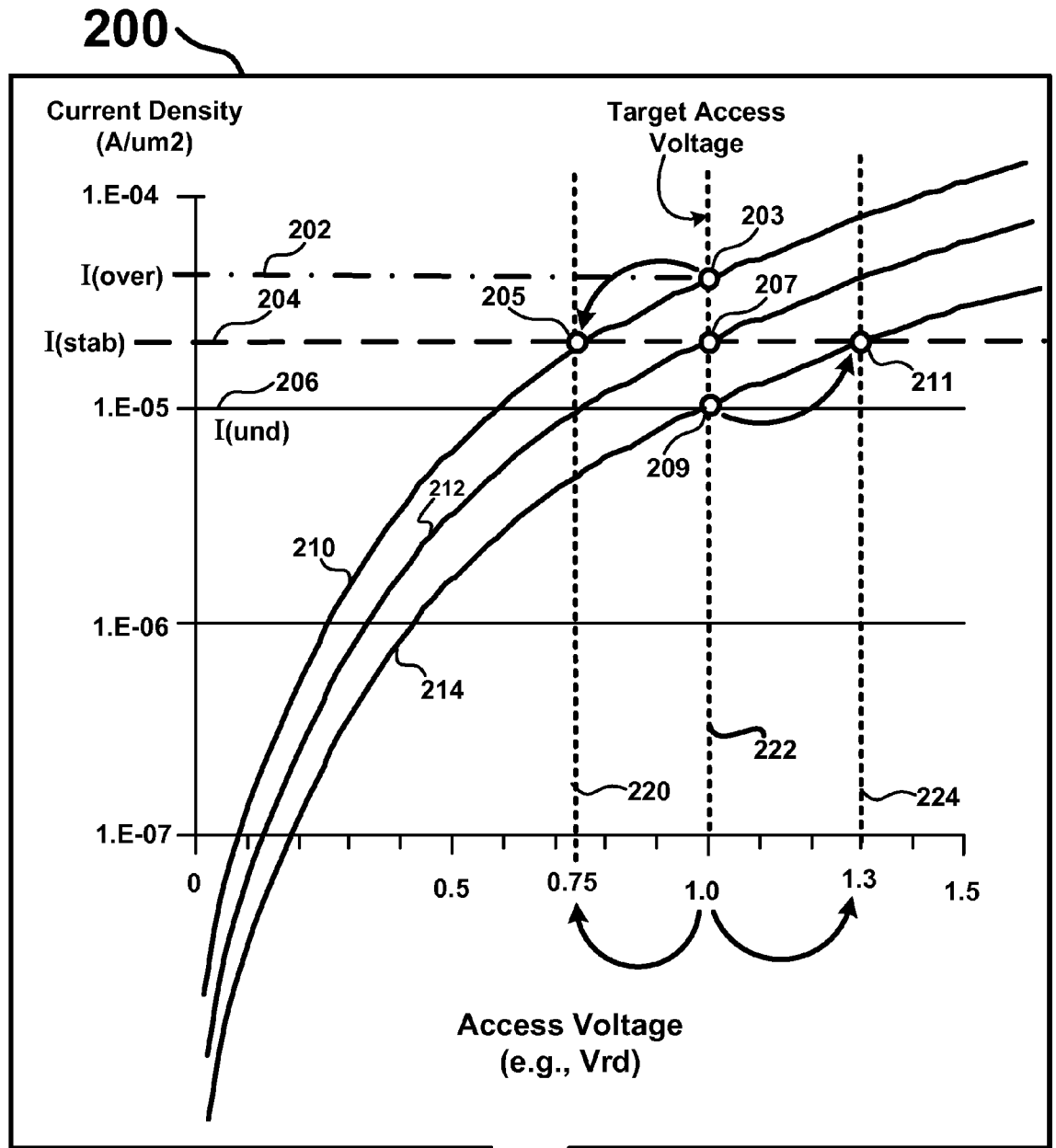
FIG. 2A is a diagram illustrating operation of a data signal adjuster in view of deviations in a read signal magnitude in accordance with various embodiments.
Figure 2A:
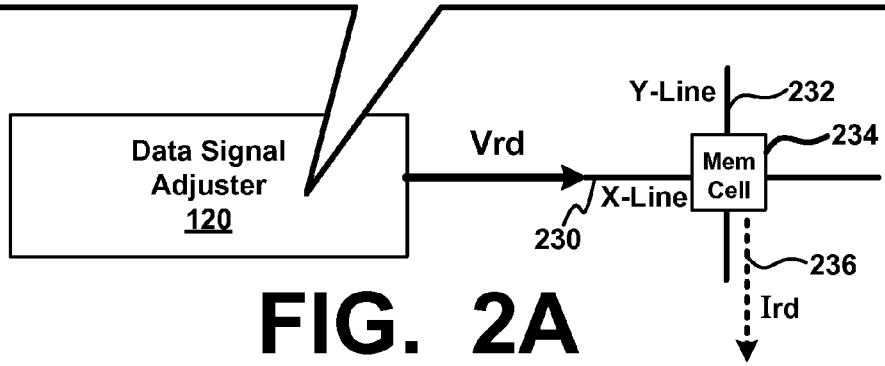

FIG. 2A is a diagram depicting operation of a data signal adjuster in view of deviations in a read signal magnitude in accordance with various embodiments. Data signal adjuster 120 is configured to modify an operating characteristic, such as a signal magnitude (e.g., a magnitude of a read current) generated by a memory cell ("Mem Cell") 234, to compensate for a deviation from a target value by the operating characteristic due to influence of a parameter. Memory cell 234 can be configured to generate a data signal having a magnitude substantially at the target value, thereby establishing a signal magnitude that is substantially independent of variation in the parameter. In the example shown, data signal adjuster 120 is configured to apply a read voltage ("Vrd") as an access signal on X-line 230 to create a current that is representative of a value of data stored in memory cell 234. Responsive to the read voltage on X-line 230, memory cell 234 generates a read current ("Ird") 236 at Y-line 232.

Depiction 200 shows non-linear profiles depicting non-linear values of read current generated in response to a read voltage, with the different non-linear profiles representing the effects of variations in a parameter on the operational characteristic, Ird. Non-linear profile 212 depicts a non-linear current for various values of read voltages, Vrd. At a target access voltage 222 of 1.0 V, for example, memory cell 234 can generate a target read current 207, which depicts a stabilized current ("I(stab)") 204. In some cases, a subset of parameter values can be determined to produce target access voltage 222. For example, a thickness of a thin-film layer in a memory cell 234 (e.g., layer EI of FIG. 2B) within the subset of parameter values can produce target read current 207. By contrast, non-linear profile 210 depicts a non-linear current for values of a read voltage as the parameter varies from the subset of parameter values. A change in temperature can produce non-linear profile 210 or 214.

Non-linear profile 210 can depict the behavior of a "fast cell." But when read voltage 222 is applied to memory cell 234, it generates a read current 203, which is depicted as an over-current ("I(over)") 202. Data signal adjuster 120 is configured to characterize the variance in the value of the parameter by determining the deviation to read current 203 from read current 207. Data signal adjuster 120 then modifies the read voltage to have a magnitude 220 (e.g., 0.75 volts). This adjusts the amount of over-current 203 to an amount of current 205. Therefore, data signal adjuster 120 compensates for the change in parameter to stabilize the current at I(stab) 204. Non-linear profile 214 can depict the behavior of a "slow cell." If read voltage 222 is applied to memory cell 234, it generates a read current 209, which is depicted as an under-current ("I(und)") 206. Data signal adjuster 120 is configured to characterize the variance in the value of the parameter by determining the deviation to read current 209 from read current 207. Data signal adjuster 120 then modifies the read voltage to have a magnitude 224 (e.g., 1.3 volts). This adjusts the amount of under-current 206 to an amount of current 211. Therefore, data signal adjuster 120 compensates for the change in a parameter to stabilize the current at I(stab) 204.

Figure 2B:
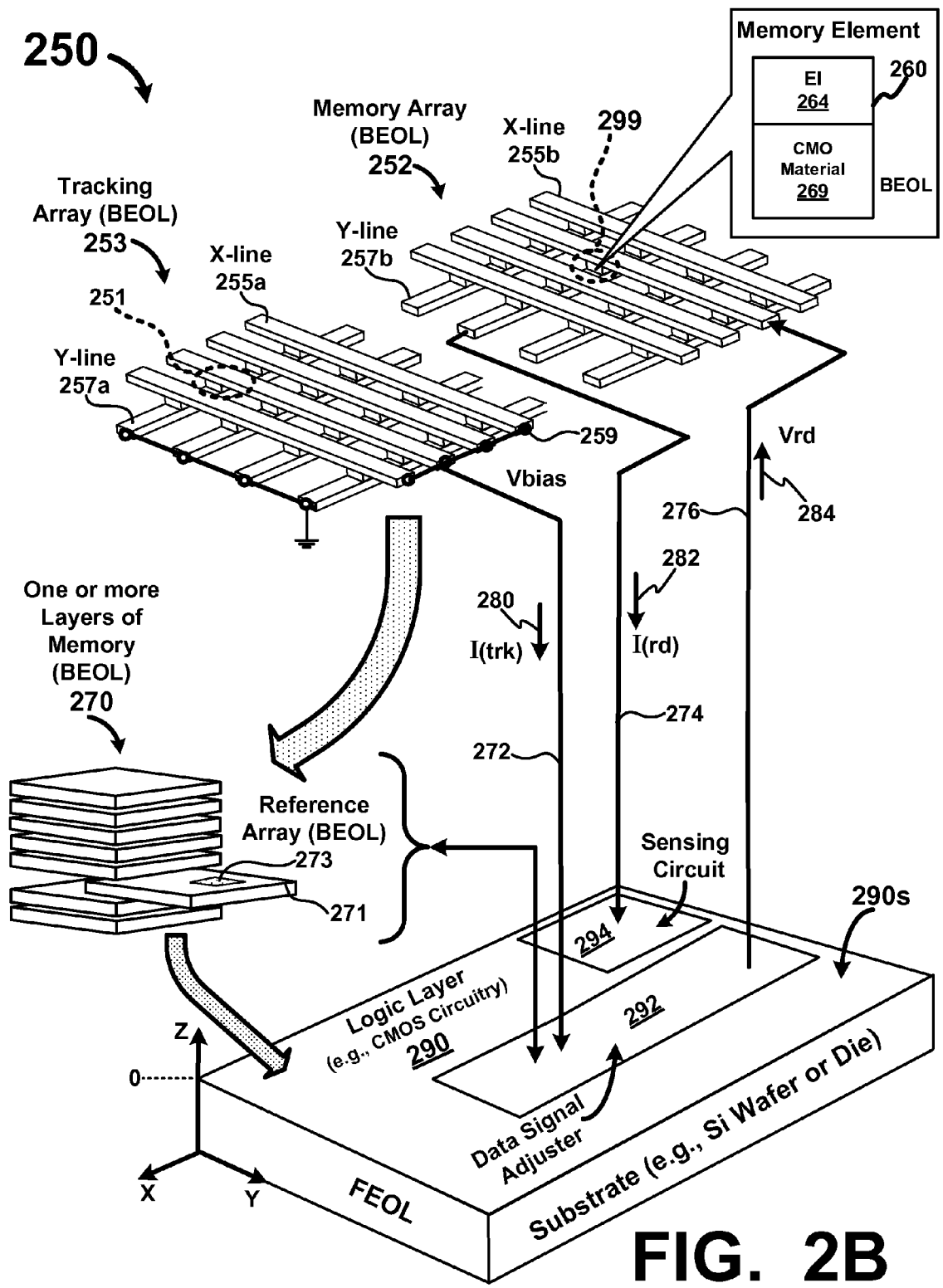
FIG. 2B is a diagram illustrating a perspective view of a portion of an integrated circuit in accordance with various embodiments.

FIG. 2B is a diagram 250 depicting a perspective view on a portion of an integrated circuit in accordance with various embodiments. Diagram 250 depicts a BEOL memory array 252 and a BEOL tracking array 253 formed in one or more layers of B memory 270 above a FEOL logic layer 290. In some embodiments, memory array 252 (or a portion thereof) and a tracking array 253 (or a portion thereof) can reside in a common memory layer. For example, memory array 252 and tracking array 253 can be formed in a layer 271 of memory 270. A BEOL reference array 273 can also be formed in layer 271 of memory 270, according to some embodiments. Logic layer 290 includes a data signal adjuster 292 (or portions thereof), and a sensing circuit 294 (or portions thereof) configured to sense or detect stored data from memory array 252.

While data signal adjuster 292 is depicted as being formed FEOL in logic layer 290, tracking array 253 can form a portion of data signal adjuster 292 that is not formed FEOL in logic layer 290 (e.g., is formed BEOL as described above), according to some embodiments.

Memory array 252 includes memory cells 299 configured to store data (e.g., in a non-volatile manner), whereas tracking array 253 includes tracking cells 251 configured to facilitate characterization of read currents associated with memory array 252. Memory array 252 and tracking array 253 each can represent an array of any size. Memory cells 299 are configured to store data in a non-volatile manner, at least in some applications. While memory array 252 and tracking array 253 can be implemented using any memory architecture in which layers of memory can stacked on each other, FIG. 2B depicts memory array 252 and tracking array 253 as cross-point arrays. In particular, memory array 252 includes memory cells 299 disposed between X-lines 255b and Y-lines 257b, whereas tracking array 253 includes tracking cells 251 disposed between X-lines 255a and Y-lines 257a. Further to the example shown, X-lines 255a are coupled together at one end and configured to receive a bias voltage, and Y-lines 257a are coupled together at one end to a common potential (e.g., ground).

According to some embodiments, data signal adjuster 292 is configured to characterize a parameter, for example, by determining (e.g., either actual or predicted) a deviation between the magnitude of read current 282 and a target magnitude (or target value), the deviation being a function of the variation in the parameter. Then, data signal adjuster 292 is configured to reduce or eliminate a deviation by the read current 282 so that it can reach a stabilized value, which can be equal or approximated to the target magnitude. To illustrate, consider the operation of data signal adjuster 292 in which it applies a bias voltage, Vbias, via conductive path 272 to ends 259 of X-lines 255a, and, in response, tracking array 253 generates a tracking current ("I(trk)") 280. Data signal adjuster 292 then receives tracking current 280, the magnitude of which is indicative of the effects of a parameter on read current ("I(rd)") 282, which conducts along conductive path 274. Further, data signal adjuster 292 generates a read voltage ("Vrd") 284 that compensates for the variations in the parameter and is applied via conductive path 276 and an X-line 255b to memory cell 299. Responsive to read voltage 284, memory cell 299 can generate a read current 282 that is stabilized at or near a target magnitude value that is sufficient for sensing circuit 294 to determine the data value associated with read current 282. Vbias is adjusted by data signal adjuster 292 until the tracking array current ("I(trk)") 280 matches the desired value as will be discussed in further detail below in regards to FIG. 4. Although the arrows depicting direction of current flow are shown flowing in one direction, the currents depicted can also flow in the opposite direction.

In some embodiments, peripheral circuitry, such as data signal adjuster 292 and sensing circuit 294, can be formed FEOL in logic layer 290 on a substrate (e.g., a semiconductor substrate, such as a silicon wafer) using complementary metal-oxide-semiconductor ("CMOS") fabrication processes, including relatively low voltage CMOS fabrications processes (e.g., to fabricate low voltage CMOS fabrication devices operable with gate voltages of 1.2 volts or less). One example of a suitable CMOS fabrication technology is nanometer technology, such as 45 nm or less. In some embodiments, memory cell 299 described in this figure or any figure herein can be implemented as a resistive memory element 260, which includes a structure 264 implementing an electrolytic insulator ("EI") and a structure 269 based on a conductive oxide material, such as a conductive metal oxide-based ("CMO-based") material, for example. Memory element 260 further can include two terminals (not shown). In various embodiments, the structure 269 can include one or more layers of a conductive oxide material, such as one or more layers of a conductive metal oxide-based ("CMO-based") material, for example. In various embodiments, structure 269 can include but is not limited to a perovskite material selected from one or more the following: PrCaMnO$_X$ (PCMO), LaNiO$_X$ (LNO), SrRuO$_X$ (SRO), LaSrCrO$_X$ (LSCrO), LaCaMnO$_X$ (LCMO), LaSrCaMnO$_X$ (LSCMO), LaSrMnO$_X$ (LSMO), LaSrCoO$_X$ (LSCoO), and LaSrFeO$_X$ (LSFeO), where x is nominally 3 for perovskites or structure 269 can be a conductive binary oxide structure comprised of a binary metal oxide having the form A$_X$O$_Y$, where A represents a metal and O represents oxygen. The conductive binary oxide material may be doped (e.g., with niobium—Nb, fluorine—F, and nitrogen—N) to obtain the desired conductive properties for a CMO. In various embodiments, electrolytic insulator 264 can include but is not limited to a material for implementing a tunnel barrier layer, the material being selected from one or more of the following: high-k dielectric materials, rare earth oxides, rare earth metal oxides, yttria-stabilized zirconium (YSZ), zirconia (ZrO$_X$), yttrium oxide (YO$_X$), erbium oxide (ErO$_X$), gadolinium oxide (GdO$_X$), lanthanum aluminum oxide (LaAlO$_X$), and hafnium oxide (HfO$_X$), and equivalent materials. Typically, the electrolytic insulator 264 comprises a thin film layer having a thickness of approximately less than 50 Å (e.g., in a range from about 10 Å to about 35 Å). In some embodiments, tracking cells 251 can be formed similar to memory cell 299, as can reference cells (not shown) formed in reference array 273. In at least one embodiment, tracking cells 251 and/or the reference cells can be formed differently from memory cell 299, using, for example, other memory technologies or other circuitry.

Figure 3:
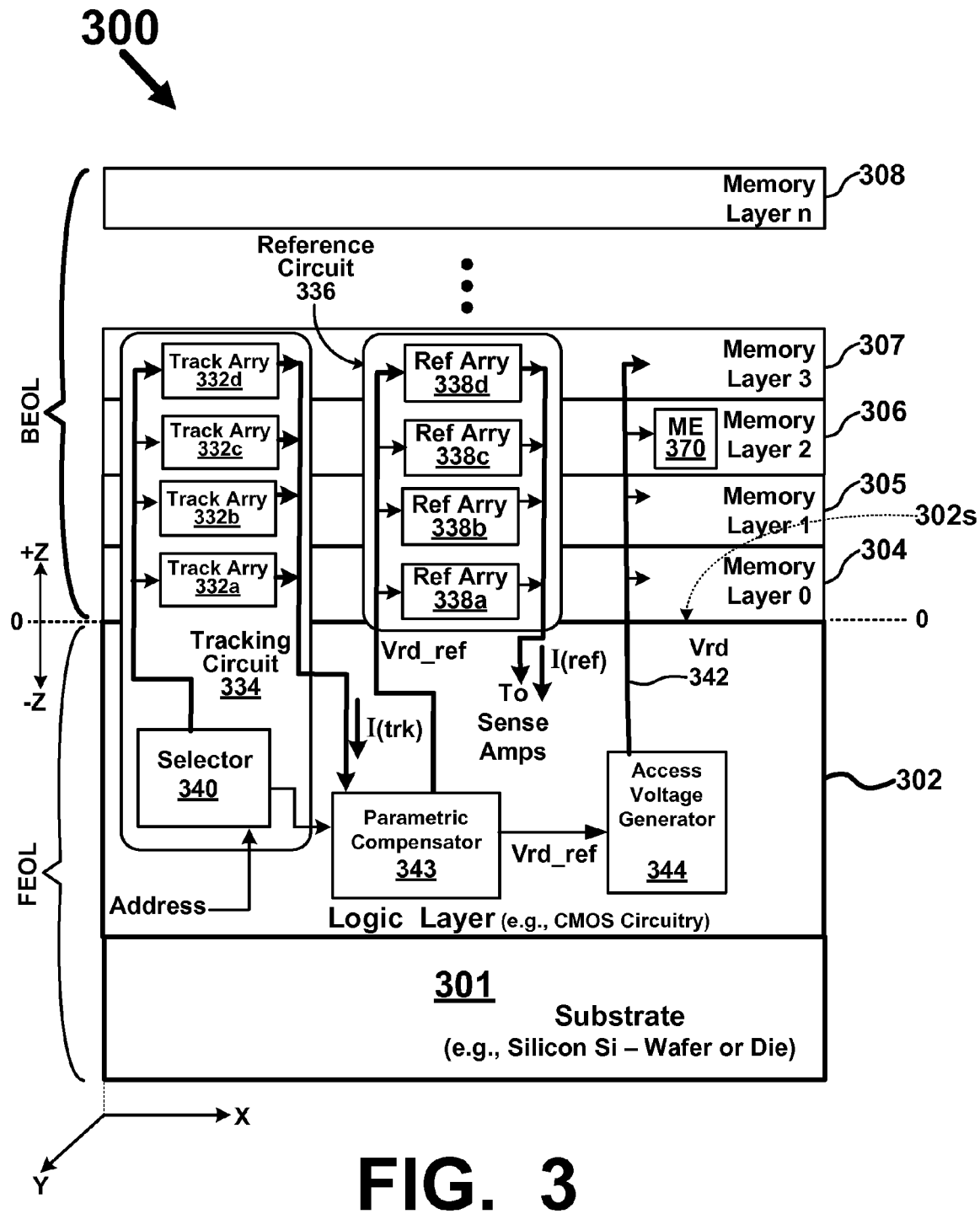
FIG. 3 depicts a cross-sectional view of an integrated circuit, according to one embodiment.

FIG. 3 depicts a cross-sectional view of an example of an integrated circuit, according to one embodiment. The cross-sectional view depicts an integrated circuit 300 having multiple BEOL memory layers 304-308 being vertically disposed above or on a FEOL logic layer 302 (e.g., disposed along a −Z axis) with the memory layers 304-308 being vertically stacked upon one another along a +Z axis, which can include logic circuitry for reading data from memory cells during read operations as well as programming and erasing logical values in the memory elements during write operations. Logic layer 302 and its logic circuitry can be formed upon a semiconductor substrate 301 with the logic circuitry having an area footprint on the semiconductor substrate along its X and Y axes such that the memory arrays in the memory layers do not add to the area footprint because they are fabricated BEOL above the logic circuitry. The logic circuitry, for example, can include a tracking circuit 334, or, as shown, a FEOL circuitry portion of tracking circuit 334 (the other memory portion residing in one or more BEOL memory layers), and a parametric compensator 343 configured to compensate for variations in a parameter by generating a read voltage reference, Vrd_ref, which is indicative of the degree to which the effects of a variation of a parameter affects a read current. The portion of tracking circuit 334 in the logic layer 302 includes a selector 340 that is configured to select a tracking array 332a-332d in one of the memory layers 304-308. Further, the logic circuitry can include an access voltage generator 344 to generate an access read voltage, such as a read voltage ("Vrd") 342 as a function of the read voltage reference, Vrd_ref.

The integrated circuit 300 comprises a unitary whole that includes the substrate 301 having circuitry fabricated on the logic layer 302 and the memory layer(s) 304-308 in contact with one another and in direct contact with and fabricated directly above the substrate 301, such that the integrated circuit 300 can comprise a single die (e.g., a silicon die). The memory layer(s) 304-308 are fabricated (e.g., grown thin-film-layer-by-thin-film-layer) directly above the substrate 301 and the circuitry of the logic layer 302 using microelectronics processes similar to those used to fabricate the circuitry in the logic layer 302. The integrated circuit 300 is not formed using conventional techniques such as multi-chip modules, wafer bonding, soldering or otherwise connecting separate substrates to one another. The configuration depicted in FIG. 3 can also represent the integrated circuit 300 prior to being singulated (e.g., prior to a plurality of die being sawn or cut from a silicon wafer) as will be described in greater detail below in regards to FIG. 11.

A FEOL interlayer interconnect structure including vias, plugs, contacts, or similar electrically conductive structures (not shown) can be fabricated on top of the active circuitry in logic layer 302 to serve as a foundation upon which the first 304 and subsequent memory layers 305-308 can be grown along the +Z axis as part of a BEOL non-volatile memory fabrication process. The interlayer interconnect structure operative to electrically couple the conductive array lines of the non-volatile cross-point memory arrays, tracking arrays, and reference arrays in each memory layers with the corresponding active circuitry in the logic layer 302. An upper surface 302s of the interlayer interconnect structure can be considered the O-point on the Z-axis where FEOL processing ends and BEOL memory layer fabrication begins.

Multiple memory layers can include a first layer 304, a second layer 305, a third layer 306, a fourth layer 307 and up to an "nth" layer 308 of third dimension memory. Here the nth layer 308 represents the uppermost layer of the memory layers and should not be construed as being the $5^{th}$ layer of memory. One or more layers 304 to 308 can include a portion of tracking circuit 334 (e.g., tracking cells) and a reference circuit 336 (e.g., reference cells). In this example, the portion of tracking circuit 334 in the memory layers includes tracking arrays ("Track Arry") 332a to 332d, each including an array of tracking cells formed in one of the memory layers 304 to 307. Although tracking arrays and reference arrays are not depicted in memory layer 308, memory layer 308 can include the tracking and reference arrays. Furthermore, the number of tracking and reference arrays and their placement in one or more memory layers will be application dependent, and in some applications all of the memory layers will include tracking and reference arrays; whereas, in other applications only some of the memory layers will include tracking and reference arrays. Tracking arrays 332a to 332d are configured to generate a tracking current, I(trk), having a magnitude indicative of a deviation of the magnitude of the read current from the target value of memory element being accessed by read voltage 342. Reference circuit 336 can include reference arrays ("Ref Arry") 338a to 338d, each including an array of reference cells formed in one of the memory layers 304 to 308. Reference arrays 338a to 338d are configured to generate a reference signal (e.g., a reference current, Iref) that tracks the variation of the parameter. As each layer of memory from layer 304 to 308 is fabricated at different times and during different processing steps, the memory cells may have structures and/or functionalities that vary from each other due to variations in semiconductor processing. With tracking cells, reference cells, and memory cell being formed in the same memory layer, these cells can behave similarly. Thus, when a memory element 370 is selected for access, then tracking array 332c and reference array 338c are selected to compensate for parameter variations to modify the read current, according to some embodiments.

To illustrate the operation of integration circuit 300, consider that a memory cell is to be accessed during a memory operation, such as a read operation or a write operation. Selector 340 is configured to decode an address to determine that memory element 370 in layer 306 is going to be accessed. Selector 340 can further be configured to select on a group of tracking cells in tracking array 332c, and to select a group of reference cells in reference array 338c. Thus, the group of the tracking cells, the group of the reference cells, and the memory are disposed in a common memory layer 306. Subsequently, parametric compensator 343 receives the tracking current from tracking array 332c, and is configured to generate an intermediate signal (e.g., Vrd_ref). The reference read voltage, Vrd_ref, is then transmitted to reference array 338c to generate a reference current, Iref, for transmission to a sense amplifier (not shown). The reference read voltage, Vrd_ref, also is transmitted to access voltage generator 344 to generate read voltage 342 to adjust a value of the read current as a function, for example, of the amount of current passing through the tracking array 332c.

Figure 4:
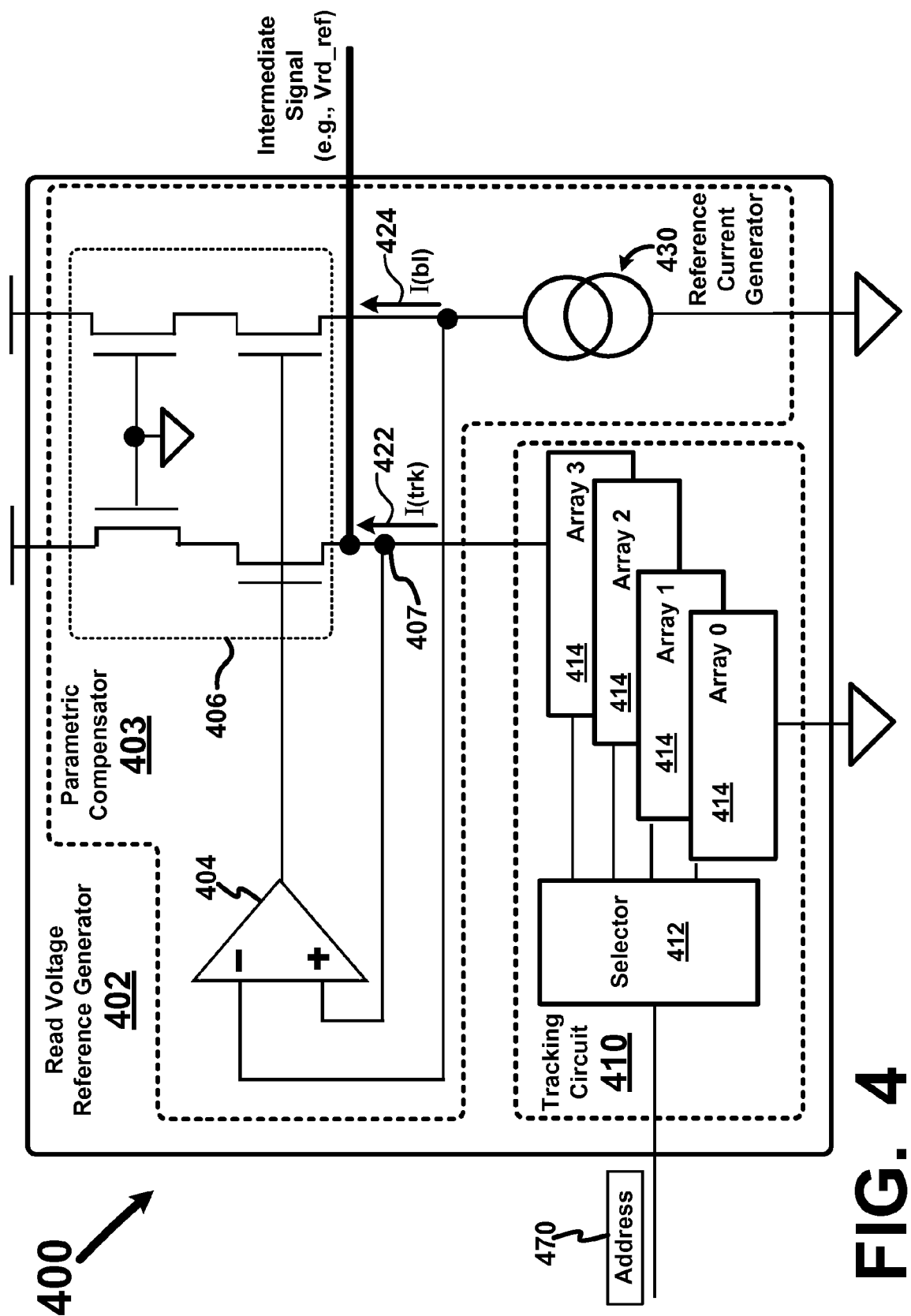
FIG. 4 is a diagram depicting an example of an access signal reference generator, according to some embodiments.

FIG. 4 is a diagram 400 depicting an example of an access signal reference generator, according to some embodiments. As shown, an access signal reference generator is configured to operate as a read voltage reference generator 402, which includes a parametric compensator 403 and a tracking circuit 410. Tracking circuit 410 includes a selector 412 (e.g., FEOL) and a number of tracking arrays 414 (e.g., BEOL), each array 414 being selectable as a function of address 470 which specifies the memory layer to be accessed. When a bias voltage is applied to node 407, an array 414 generates a tracking current ("I(trk)") 422. In some embodiments, tracking current 422 can have a magnitude indicative of the deviation of the magnitude of the signal (e.g., a read current magnitude) from a stabilized or targeted value. Parametric compensator 403 includes a biasing circuit 406 electrically coupled with the tracking current ("I(trk)") 422 and a baseline current ("I(bl)") 424. Baseline current 424 is generated by a reference current generator 430. Parametric compensator 403 also includes an amplifier 404 that is configured to adjust operation of biasing circuit 406 to maintain a match between the magnitudes of tracking current 422 and baseline current 424. As a parameter (e.g., temperature or the thickness of a thin-film layer) varies, the selected array 414 generates a magnitude of tracking current 422 that varies as an effect of the variation in the parameter, which, in turn, generates a read voltage reference signal, Vrd_ref. In some embodiments, parametric compensator 403 can be configured to characterize the parameter to adjust a signal magnitude (e.g., for a read current) generated by a memory cell. Parametric compensator 403 can compare tracking signal 422 to baseline signal 424, and, in turn, modify the biasing signal to form a modified biasing signal. Amplifier 404, in some instances, is configured to modify the biasing signal. In some embodiments, the modified biasing signal is an intermediate signal. For example, the modified biasing signal can be a read voltage reference signal, Vrd_ref.

In some embodiments, arrays 414 includes a number of tracking cells each configured to generate an individual current that is a portion of baseline current 424, with tracking current 422 representing an aggregate current composed of the individual currents for each tracking cell. By using a group of tracking cells to derive a unitary current, relatively extreme variations in a parameter that affect only a subset of memory cells can be deemphasized by averaging the individual tracking cell currents. Thus, implementing a group of tracking cells can enhance the accuracy of determining and/or predicting the uncompensated read current. In some embodiments, baseline current 424 can be 3 μA, or within a range about this value. In some implementations, reference current generator 430 can be a band gap reference configured to generate 3 μA, or can be implemented with other suitable current generation circuits.

Figure 5:
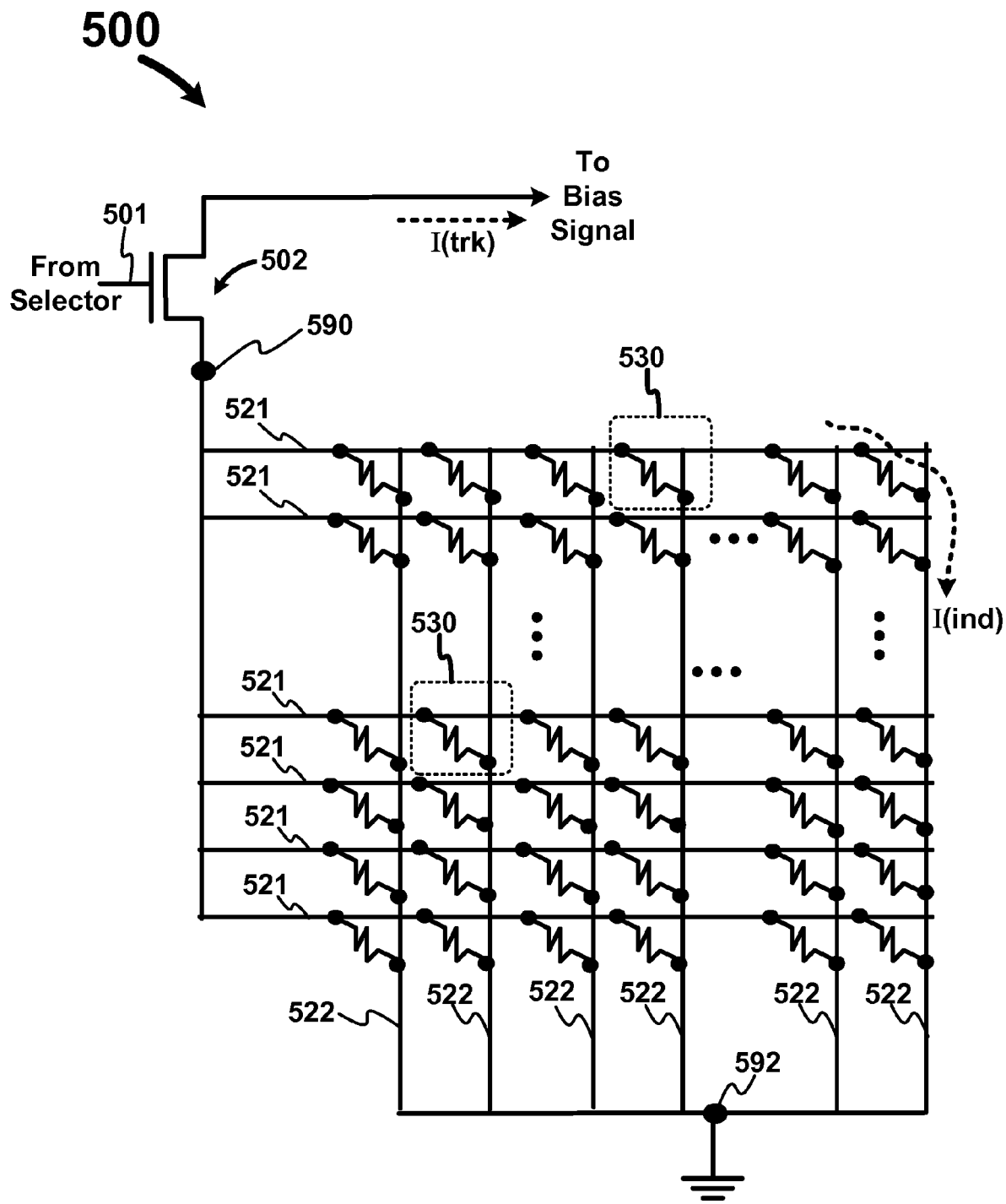
FIG. 5 is a diagram depicting an example of a tracking array, according to some embodiments.

FIG. 5 is a diagram depicting an example of a tracking array, according to some embodiments. Tracking array 500 includes a group of tracking cells 530 each arranged so that a first terminal is coupled via row lines 521 to node 590 and a second terminal is coupled via bit lines 522 to node 592, which is coupled to ground. When a corresponding memory cell (not shown) is selected for access during, for example, a read operation, a selector circuit can apply a control signal to terminal 501 of pass gate 502, thereby coupling node 590 to a biasing signal to generate a tracking current, I(trk). As each tracking cell 530 can generate an individual current, I(ind), the aggregate of the individual currents can constitute the tracking current I(trk). According to some embodiments, the number of tracking cells in tracking array 500 is 1,000, with each tracking cell configured to draw 3 nA. Therefore, the tracking current can be 3 μA (i.e., 3 nA×1,000 tracking cells) for a certain value for a parameter (or for a range of values).

Figure 6A:
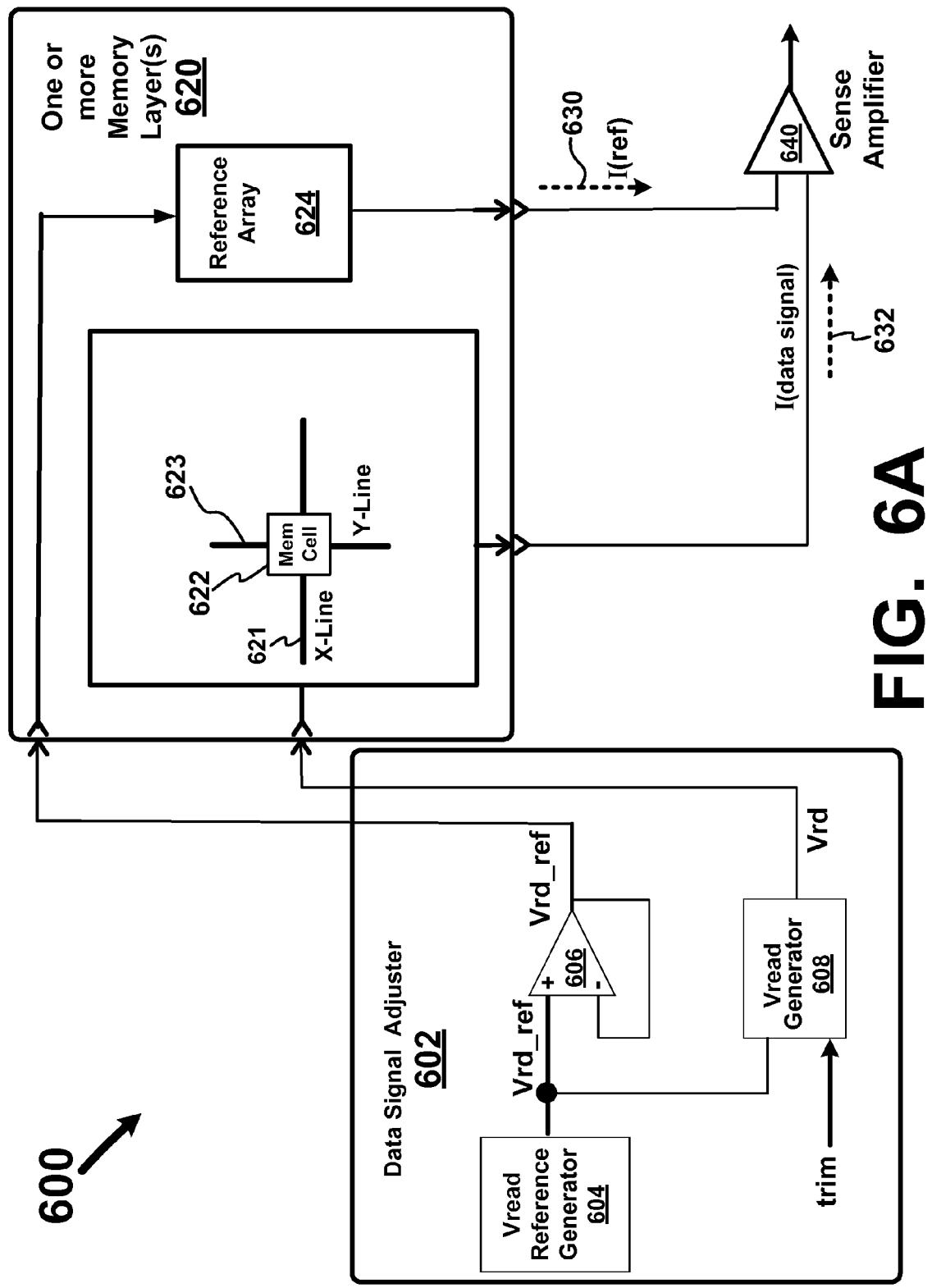
FIG. 6A is a diagram depicting an example of a data signal adjuster configured to generate signals for a memory cell and a reference array, according to some embodiments.

FIG. 6A is a diagram 600 depicting an example of a data signal adjuster configured to generate signals for a memory cell 622 and a reference array 624, according to some embodiments. Data signal adjuster 602 includes a read voltage ("Vrd") reference generator 604 configured to generate a read voltage reference signal, Vrd_ref, as an intermediate signal for transmission to an optional unity buffer 606. Data signal adjuster 602 also includes a read voltage ("Vread") generator 608 configured to generate a read voltage, Vrd, as an access signal to adjust a data signal current (e.g., read current) 632 so that it operates at or near a target magnitude. In some embodiments, read voltage reference generator 604 is configured to modify the magnitude of the intermediate signal (e.g., Vrd_ref) by an amount to generate an access signal (e.g., Vrd) that at least approximates (e.g., is within a range about) the stabilized value. The access signal is configured to cause the memory cell 622 to generate a data value associated with the stabilized value. In some embodiments, read voltage generator 608 is configured to boost the magnitude of the intermediate signal by the amount as determined by a trim value (e.g., a programmable trim value). In some embodiments, read voltage reference generator 604 is configured to generate an intermediate signal by setting the magnitude of the intermediate signal below the magnitude of an access signal to reduce disturb effects associated with, for example, higher magnitudes. For example, read voltage reference generator 604 can generate a read voltage reference signal, Vrd_ref, that is less than the magnitude of the read voltage, Vrd, to reduce or eliminate disturb effects caused by read operations in one or more layers of memory.

As shown, read voltage generator 608 transmits a read voltage, Vrd, via X-line 621 to memory element 622 in one or more memory layers 620, the read voltage being modified to compensate for variations in parameters. In turn, memory element 622 generates a read current and transmits it via Y-line 623 as a data signal current 632. This current is at or near a target magnitude for reliable sensing by sense amplifier 640 to determine the date value accurately. Read voltage reference generator 604 transmits a read voltage reference signal, Vrd_ref, to a reference array 624. The array 624 includes one or more reference cells (not shown) operative to generate a reference current ("Iref") 630. Reference array 624 can generate a reference signal, Iref, as a function of intermediate signal, Vrd_ref. In some cases, the reference signal can be generated by applying the intermediate signal to a group of reference cells that are electrically coupled together in parallel to generate a reference signal.

Figure 6B:
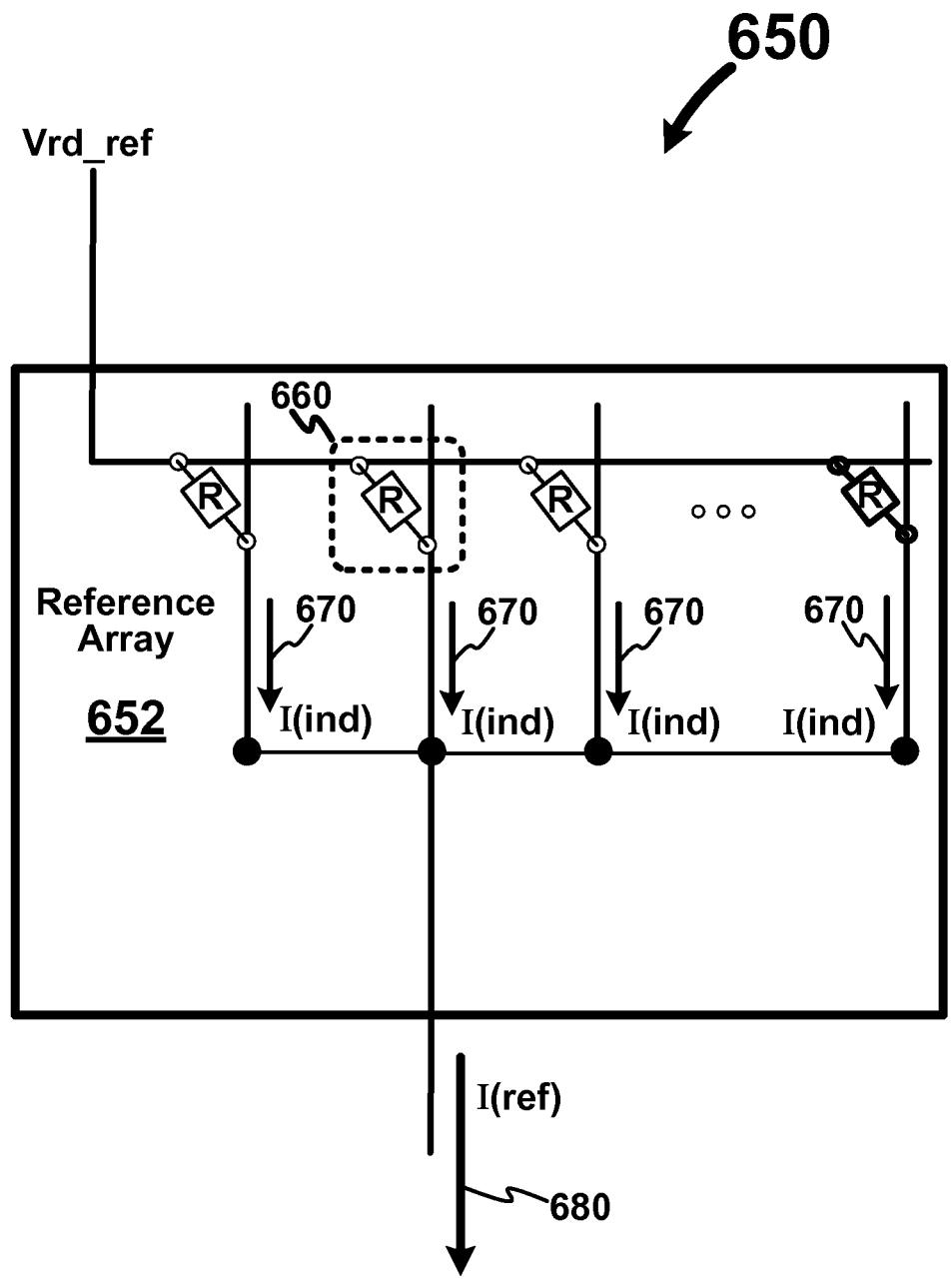
FIG. 6B is a diagram illustrating an example of a reference array, according to various embodiments.

FIG. 6B is a diagram 650 depicting an example of a reference array, according to various embodiments. As shown, reference array 652 includes a number of reference cells ("R") 660 coupled together in parallel, where each reference cell 660 can generate an individual current ("I(ind)") 670. The aggregated amounts of the individual currents 670 can constitute reference current 680. Further, a number of reference cells 660 can be selected to generate a certain level of reference current. For example, consider that reference array 652 includes a quantity of 5 reference cells 660. And if individual currents 670 are 3 nA each, then reference current 680 is equivalent to 15 nA (e.g., 5 cells×3 nA). Note further that reference current 680 is compensated for due to variations in parameters as its magnitude is a function of the intermediate signal.

Figure 7:
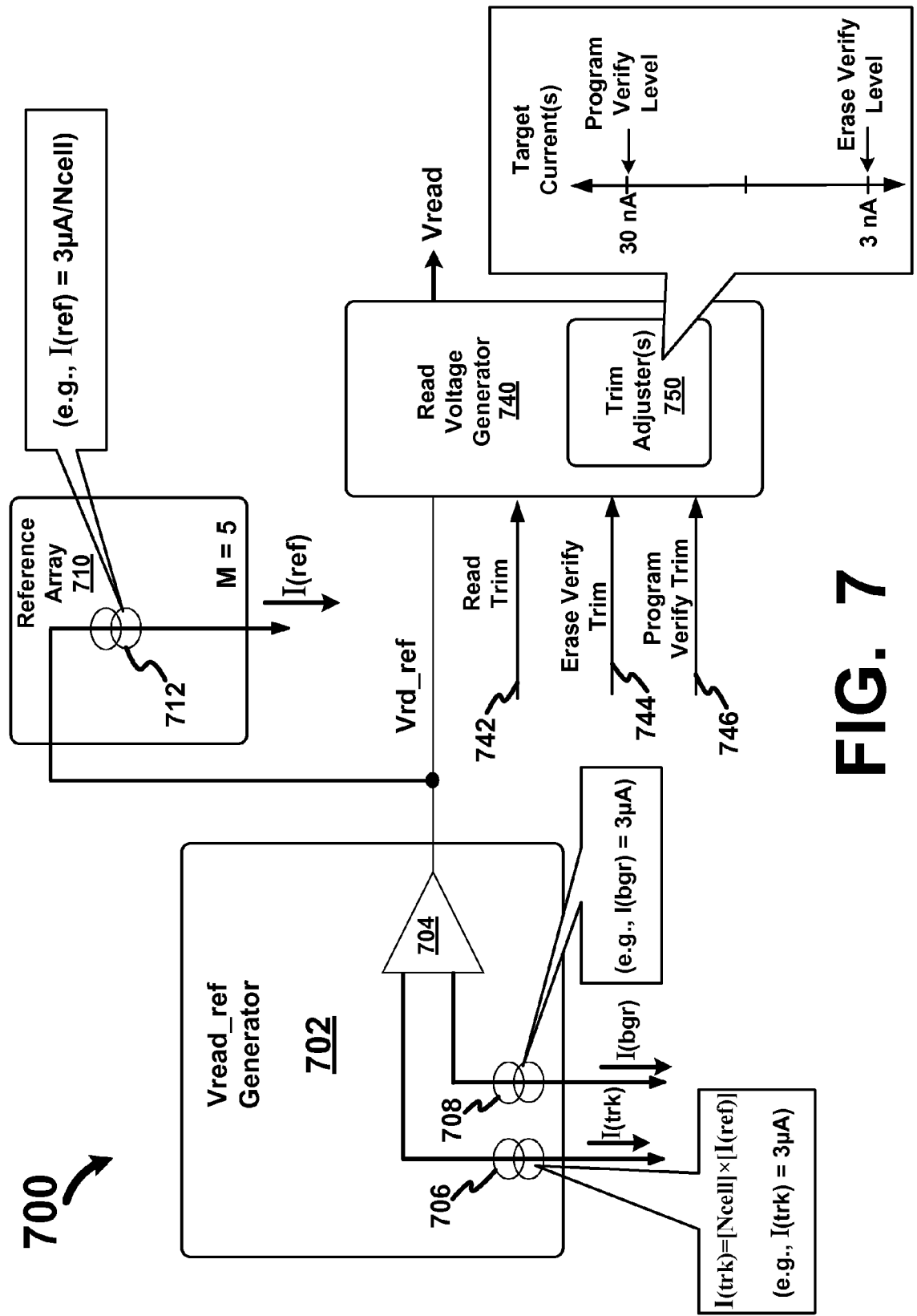
FIG. 7 is a diagram illustrating another example of a data signal adjuster, according to various embodiments.

FIG. 7 is a diagram depicting another example of a data signal adjuster, according to various embodiments. Data signal adjuster 700 includes a read voltage reference ("Vread_ref") generator 702, a reference array 710, and a read voltage generator 740, which, in this example, includes trim adjuster(s) 750. Read voltage reference generator 702 includes an amplifier 704 configured to generate an intermediate signal, Vrd_ref, based on currents generated by a first current source 706 modeling current from a tracking array, and by a second current source 708 modeling a band gap reference circuit, or some other current source suitable as a current reference. Reference array 710 can be modeled as a current source 712 that generates a compensated reference current based on the intermediate signal, Vrd_ref. Read voltage generator 740 is configured to receive intermediate signal, Vrd_ref, as well as a read trim control signal 742, a erase verify trim control signal 744, and a program verify trim control signal 746. Read trim control signal 742 is configured to program a trim adjuster 750 to adjust or boost intermediate signal, Vrd_ref, by an amount to set the read. Erase verify trim control signal 744 is configured to program a trim adjuster 750 to adjust an intermediate signal, Vrd_ref, by an amount to verify that a memory element is erased by trimming the read current to, for example, 30 nA. Program verify trim control signal 746 is configured to program a trim adjuster 750 to adjust an intermediate signal, Vrd_ref, by an amount to verify that a memory element is programmed sufficiently by trimming the read current to, for example, 3 nA.

Figure 8A:
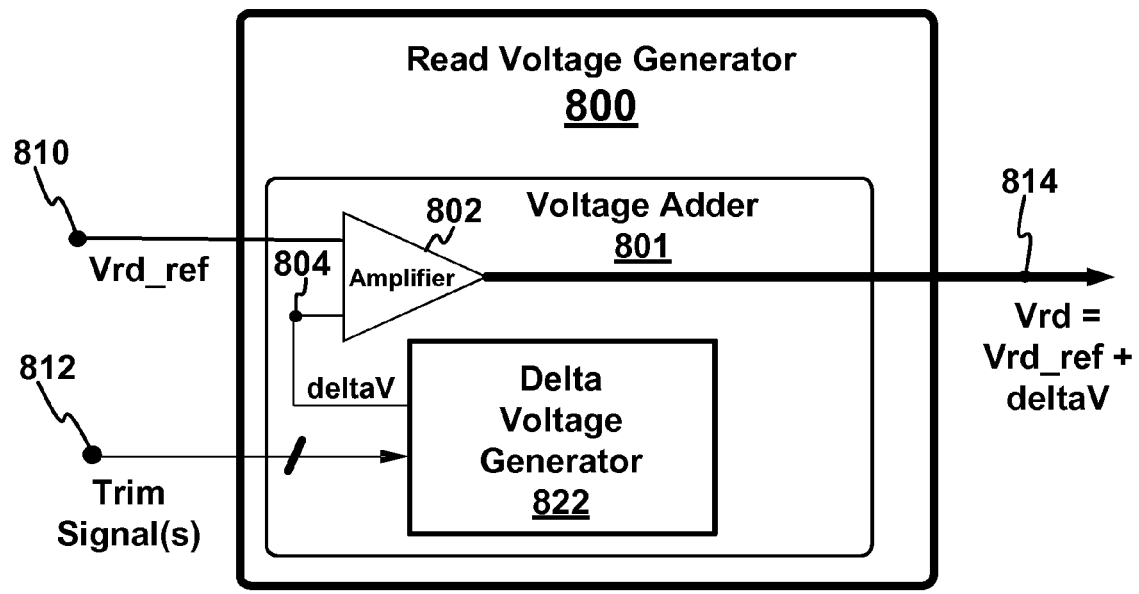
FIGS. 8A and 8B depict examples of read voltage generators, according to some embodiments.
Figure 8B:
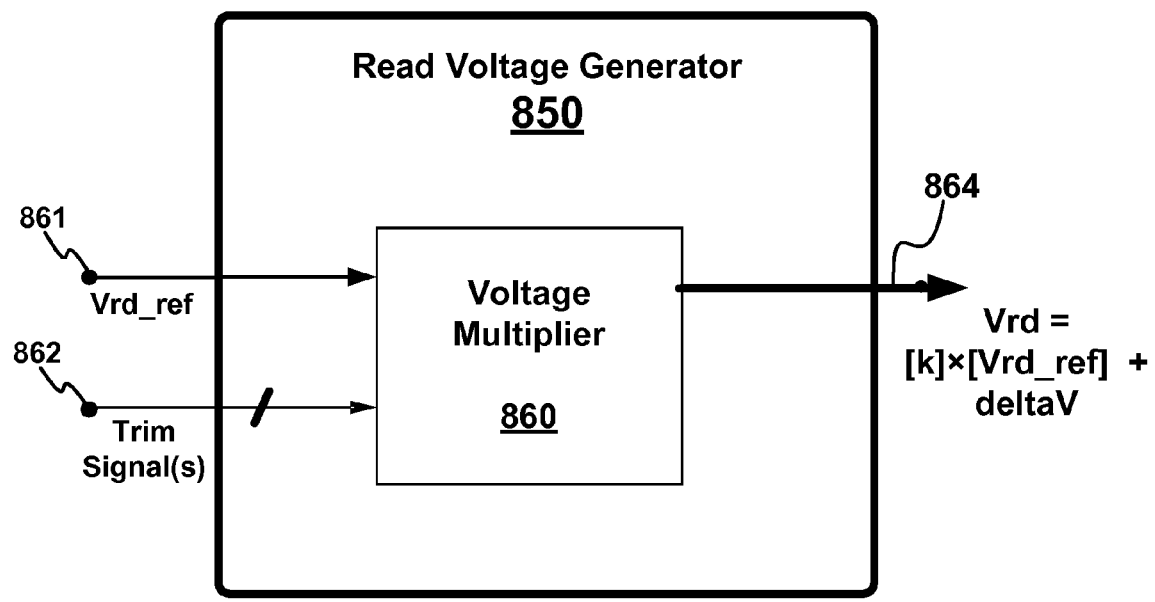

FIGS. 8A and 8B depict examples of read voltage generators, according to some embodiments. In FIG. 8A, read voltage generator 800 includes a voltage adder 801 having a terminal 810, a terminal 812, and a terminal 814, and includes an amplifier 802 and a delta voltage generator 822. Voltage adder 801 is configured to accept an intermediate signal, Vrd_ref via terminal 810, and trim signal(s) via terminal 812. The trim signal(s) are control signals for configuring delta voltage generator 822 to generate a deltaV signal at terminal 804. Amplifier 802 adds the value of deltaV to the value of Vrd_ref to generate the read voltage, Vrd, at terminal 814. In FIG. 8B, read voltage generator 850 includes a voltage multiplier 860 having a terminal 861, a terminal 862, and a terminal 864. Voltage multiplier 860 is configured to accept an intermediate signal, Vrd_ref via terminal 861, and trim signal(s) via terminal 862. The trim signal(s) are control signals for configuring voltage multiplier 860 to add a deltaV signal to the product of a constant k, and the intermediate signal, Vrd_ref at terminal 804, or in an alternate embodiment to modify the constant k to obtain a different product of the constant k and the intermediate signal, Vrd_ref at terminal 804. Voltage multiplier 860 generates the read voltage, Vrd, at terminal 864.

Figure 9:
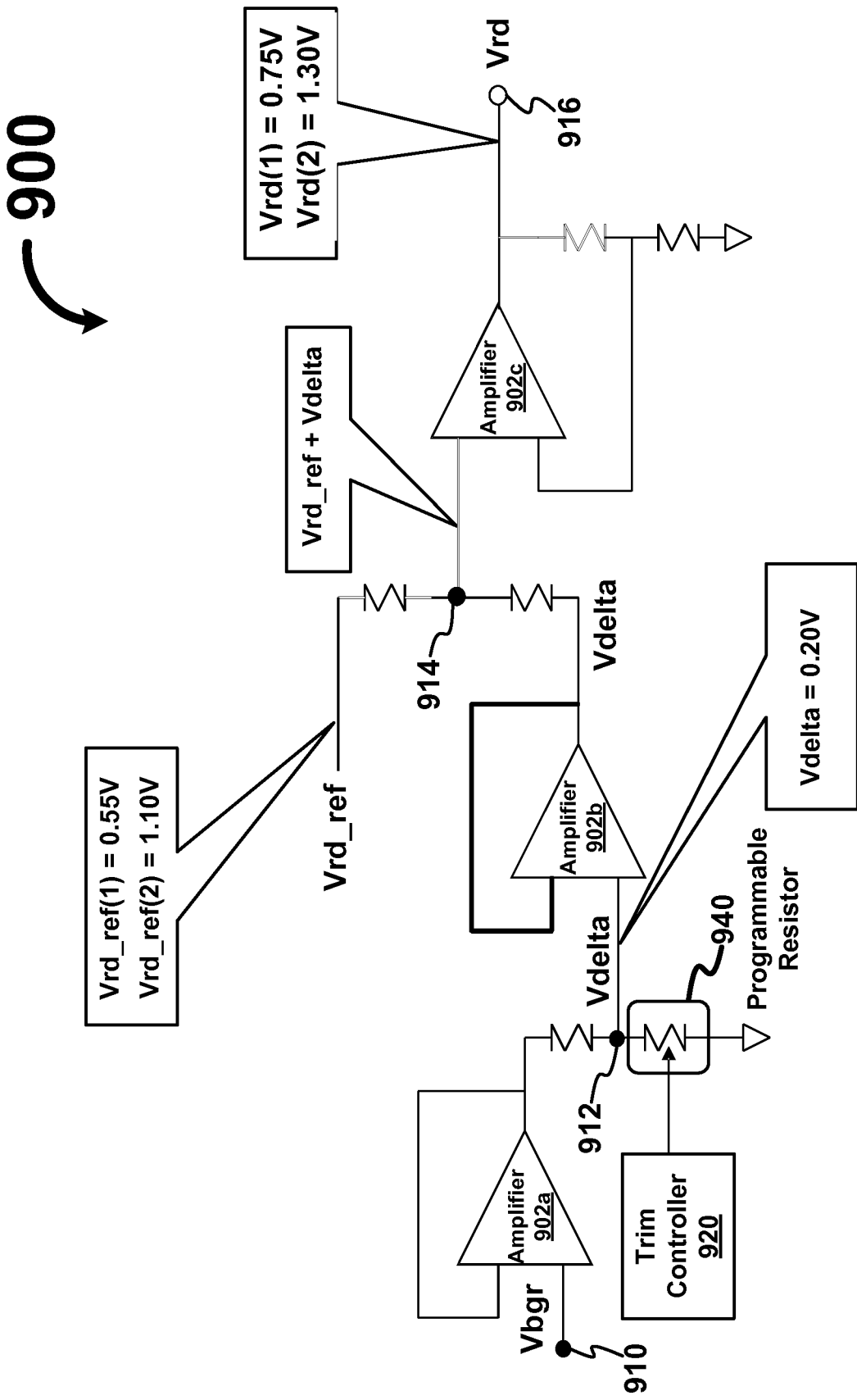
FIG. 9 depicts an example of a voltage adder, according to some embodiments.

FIG. 9 depicts an example of a voltage adder, according to some embodiments. Voltage adder 900 includes amplifiers 902a, 902b, and 902c, a trim controller 920, a programmable resistor 940, and various resistor elements. Trim controller 920 is configured to provide a trim control signal that controls the resistance of programmable resistor 940. With a band gap reference voltage ("Vbgr") applied to node 910, programmable resistor 940 generates a voltage Vdelta at node 912. Amplifiers 902a and 902b can be unity buffer amplifiers. Amplifier 902c is configured to add the values of Vrd_ref, such as 0.55V, to the value of Vdelta, such as 0.20V, thereby generating a read voltage, Vrd, of 0.75V at terminal 916. Note that voltage adder 900 can be used to generate erase verify read voltages and program verify read voltages.

Figure 10A:
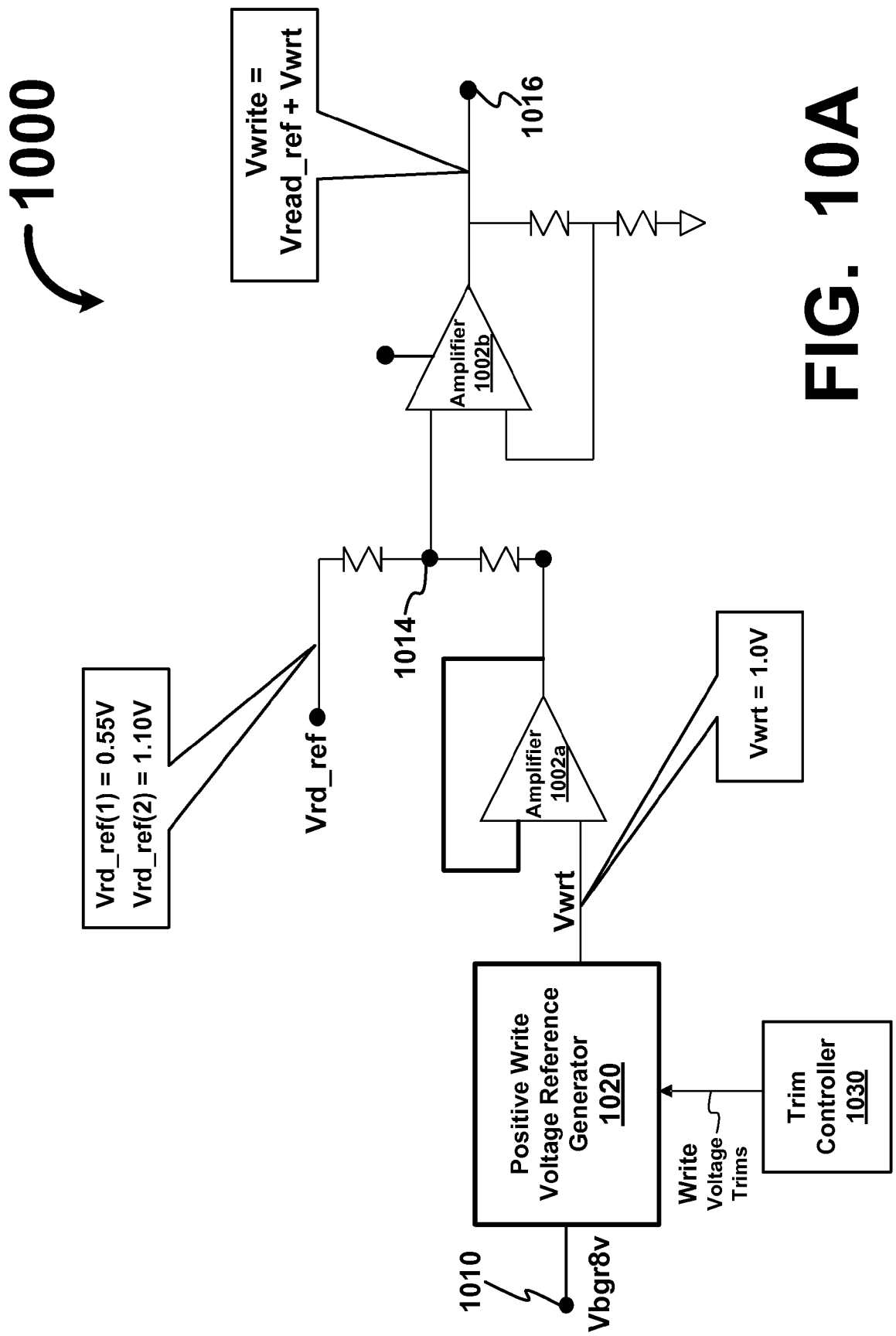
FIG. 10A depicts one example of circuitry for a write voltage generator, according to various embodiments.

FIG. 10A depicts an example of a write voltage generator, according to some embodiments. Write voltage generator 1000 includes positive write voltage reference generator 1020, a trim controller 1030, amplifiers 1002a and 1002b, and various resistor elements. Here, the circuitry depicted in FIG. 10A can be FEOL circuitry as described above. Positive write voltage reference generator 1020 receives input voltage Vbgr8V and outputs voltage Vwrt whose magnitude is base on trim control signals from trim controller 1030. Amplifiers 1002a and 1002b are configured to add output voltage to voltage Vrd_ref such that the output 1016 of amplifier 1002b is a write voltage Vwrite=Vread_ref+Vwrt. FIG. 10A depicts examples of voltages for Vrd_ref and Vwrt. As one example, if positive write voltage reference generator 1020 outputs 1.0V based on the input voltage value Vbgr8V and trim control signals from trim controller 1030 and Vread_ref=1.10V, then Vwrite=1.0V+1.10V=2.10V. Actual values for the voltages will be application dependent and may be higher or lower than the voltages depicted. Here, a reference voltage other than Vread_ref can be used; however, Vread_ref is used in this example for the write circuitry because Vread_ref is already available due to its use for the read circuitry described above.

Figure 10B:
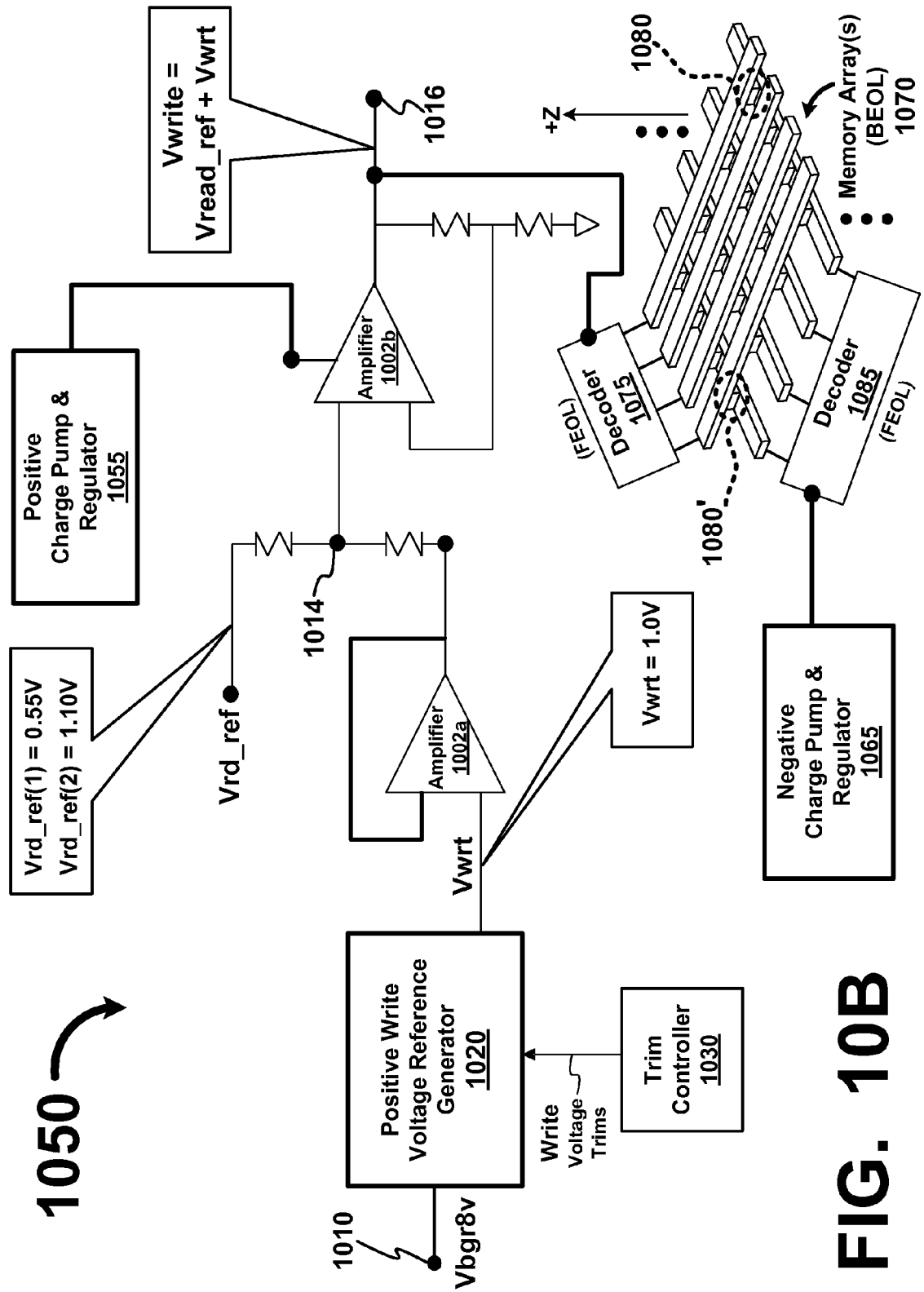
FIG. 10B depicts one example of circuitry for generating positive and negative write voltages to decoder circuitry using the circuitry of FIG. 10A, according to various embodiments.

FIG. 10B depicts an example of using the positive write voltage reference generator 1020 and circuitry of FIG. 10A to generate positive and negative write voltages to decoder circuitry electrically coupled with a BEOL memory array(s). Write voltage circuitry 1050 includes a positive charge pump and regulator 1055, a negative charge pump and regulator 1065, a decoder 1075, a decoder 1085, and a memory array(s) 1070 electrically coupled with the decoders 1075 and 1085. Here, all of the circuitry depicted, sans the memory array(s) 1070 can be FEOL circuitry; whereas the memory array(s) 1070 can be BEOL memory. Although only one memory array 1070 is depicted, there can be a plurality of memory layers positioned above, below, or above and below the array 1070, and those memory layers can include the aforementioned tracking arrays and reference arrays and their associated tracking and reference cells. The decoders 1075 and 1085 are electrically coupled with the conductive array lines of the memory array(s) 1070. For example, decoder 1075 can be electrically coupled with the X-lines (e.g., Word Lines) and decoder 1085 can be electrically coupled with the Y-lines (e.g., Bit Lines).

Negative charge pump and regulator 1065 is electrically coupled with decoder 1085 and is operative to supply power for one-half of the voltage potential for a write operation to a selected memory element 1080 (e.g., a discrete two-terminal memory element) in the array 1070, such as selected memory cell 1180'. Positive charge pump and regulator 1055 is electrically coupled with amplifier 1002b and is operative to supply the power for the other half of the of the voltage potential for the write operation. Output 1016 from amplifier 1002b is electrically coupled with decoder 1075. Negative charge pump and regulator 1065 can supply a negative voltage potential to decoder 1085 which applies the negative voltage potential to the appropriate array line. Similarly, via positive charge pump and regulator 1055, amplifier 1002b supplies a positive voltage potential to decoder 1075 which applies the positive voltage potential to the appropriate array line. The potential difference between the positive and negative voltage potentials comprises the write voltage applied across the selected memory element 1080' (e.g., across the two-terminals of the memory element 1080').

Although FIGS. 10A and 10B depict circuitry for adjusting the positive write voltage potential, one skilled in the art will appreciate that the circuitry depicted n FIGS. 10A and 10B can be used to electrically couple the negative charge pump and regulator 1065 to circuitry similar to that of the positive charge pump and regulator 1055 (e.g., circuitry similar to 1020, 1030, 1002a, and 1002b) to adjust the negative write voltage potential. Therefore, circuitry depicted in FIGS. 10A and 10B can be used to adjust the positive write voltage potential only, the negative write voltage potential only, or both positive and negative write voltage potentials.

Figure 11:
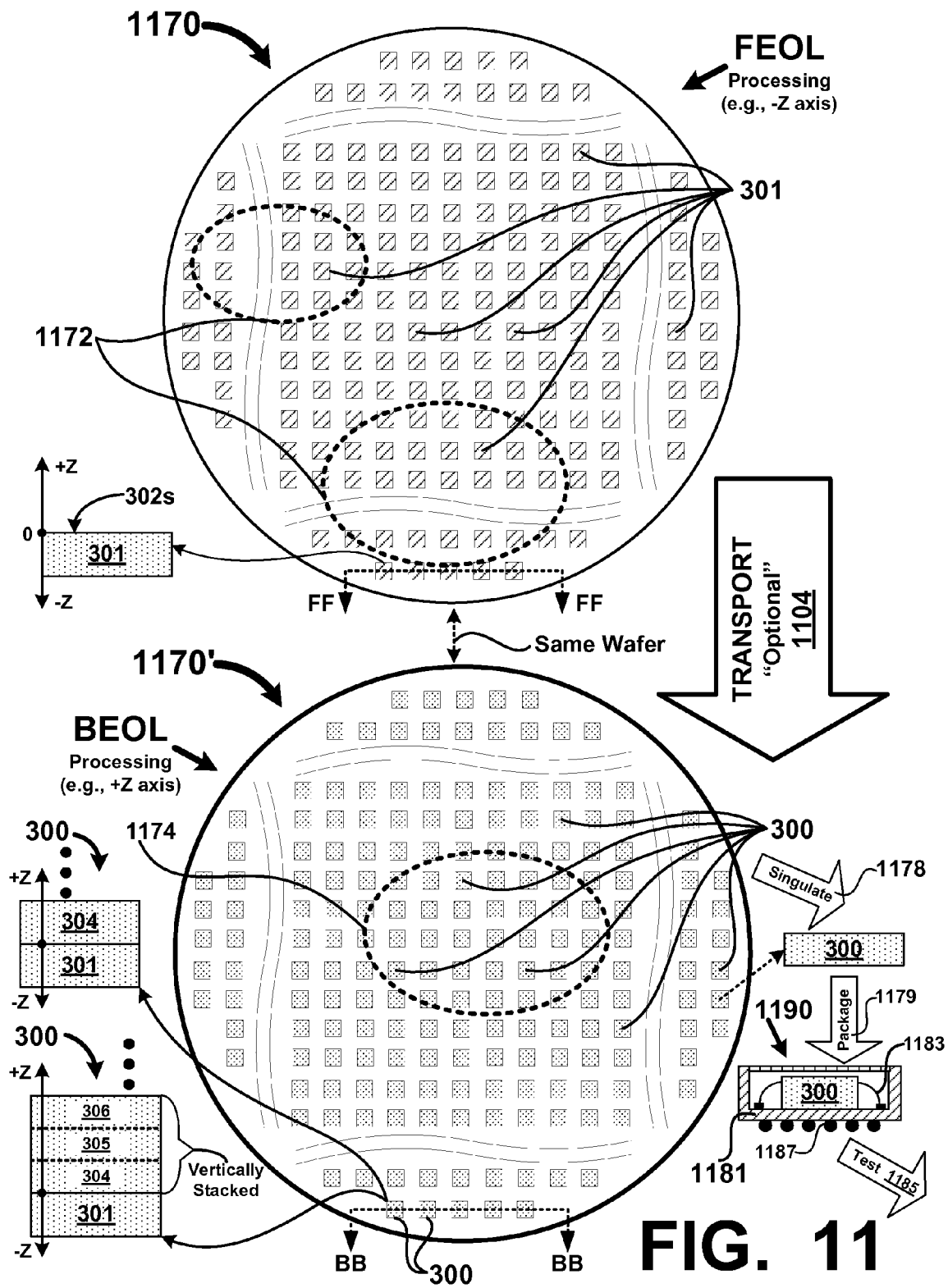
FIG. 11 depicts top plan views of a wafer processed FEOL to form a plurality of base layer die including active circuitry and the same wafer subsequently processed BEOL to form one or more layers of memory directly on top of the base layer die where the finished die can subsequently be singulated, tested, and packaged into integrated circuits.

FIG. 11 is a top plan view depicting a single wafer (denoted as 1170 and 1170') at two different stages of fabrication: FEOL processing on the wafer denoted as 1170 during the FEOL stage of processing where active circuitry in logic layer 302 is fabricated on the substrate 301 (e.g., silicon wafer); followed by BEOL processing on the same wafer denoted as 1170' during the BEOL stage of processing where one or more layers (e.g., 304-308) of non-volatile memory are formed. Wafer 1170 includes a plurality of the base layer die 301 (see 301 in FIG. 3) formed individually on wafer 1170 as part of the FEOL process. As part of the FEOL processing, the base layer die 301 may be tested 1172 to determine their electrical characteristics, functionality, performance grading, etc. After all FEOL processes have been completed, the wafer 1170 is optionally transported 1104 for subsequent BEOL processing (e.g., adding one or more layers of memory such as single layer 304 or multiple layers 305, ... 308) directly on top of each base layer die 301. A base layer die 301 is depicted in cross-sectional view along a dashed line FF-FF where the substrate the die 301 is fabricated on (e.g., a silicon Si wafer) and its associated active circuitry in logic layer 302 are positioned along the −Z axis. For example, the one or more layers of memory (e.g., 304-308) are grown directly on top of an upper surface 302s of each base layer die 301 as part of the subsequent BEOL processing. Upper layer 302s can be an upper planar surface of the aforementioned interlayer interconnect structure operative as a foundation for subsequent BEOL fabrication of the memory layers along the +Z axis.

During BEOL processing the wafer 1170 is denoted as wafer 1170', which is the same wafer subjected to additional processing to fabricate the memory layer(s) directly on top of the base layer die 301. Base layer die 301 that failed testing may be identified either visually (e.g., by marking) or electronically (e.g., in a file, database, email, etc.) and communicated to the BEOL fabricator and/or fabrication facility. Similarly, performance graded base layer die 301 (e.g., graded as to frequency of operation) may identified and communicated to BEOL the fabricator and/or fabrication facility. In some applications the FEOL and BEOL processing can be done by the same fabricator or performed at the same fabrication facility. Accordingly, the transport 1104 may not be necessary and the wafer 1170 can continue to be processed as the wafer 1170'. The BEOL process forms the aforementioned memory layer(s) directly on top of the base layer die 301 to form a finished die 300 (see above reference to die 300 in regards to FIG. 3) that includes the FEOL circuitry portion 301 along the −Z axis and the BEOL memory portion along the +Z axis. A cross-sectional view along a dashed line BB-BB depicts a memory device die 300 with a single layer of memory 304 grown (e.g., fabricated) directly on top of base die 301 along the +Z axis, and alternatively, another memory device die 300 with three vertically stacked layers of memory 304, 305, and 306 grown (e.g., fabricated) directly on top of base die 301 along the +Z. Finished die 300 on wafer 1170' may be tested 1174 and good and/or bad die identified. Subsequently, the wafer 1170' can be singulated 1178 to remove die 300 (e.g., die 300 are precision cut or sawed from wafer 1170') to form individual memory device die 300. The singulated die 300 may subsequently be packaged 1179 to form integrated circuit chip 1190 for mounting to a PC board or the like, as a component in an electrical system (not shown). Here a package 1181 can include an interconnect structure 1187 (e.g., pins, solder balls, or solder bumps) and the die 300 mounted in the package 1181 and electrically coupled 1183 with the interconnect structure 1187 (e.g., using wire bonding). The integrated circuits 1190 (IC 1190 hereinafter) may undergo additional testing 1185 to ensure functionality and yield. The die 300 or the IC 1190 can be used in any system requiring non-volatile memory and can be used to emulate a variety of memory types including but not limited to SRAM, DRAM, and FLASH. Unlike conventional FLASH non-volatile memory, the die 300 and/or the IC's 1190 do not require an erase operation or a block erase operation prior to a write operation so the latency associated with conventional Flash memory erase operations is eliminated and the latency associated with FLASH OS and/or FLASH file system required for managing the erase operation is eliminated. Another application for the IC's 1190 is as a replacement for conventional FLASH-based non-volatile memory in solid state drives (SSD's) or hard disc drives (HDD's).

In at least some of the embodiments of the invention, the structures and/or functions of one or more of the above-described features and/or elements can be implemented in software, hardware, firmware, circuitry, or a combination thereof. Note that the structures and constituent elements shown in the figures, as well as their functionality, can be aggregated with one or more other structures or elements. Alternatively, the elements and their functionality can be subdivided into constituent sub-elements, if any.

The various embodiments of the invention can be implemented in numerous ways, including as a system, a process, an apparatus, or a series of program instructions on a computer readable medium such as a computer readable storage medium or a computer network where the program instructions are sent over optical or electronic communication links. In general, the steps of disclosed processes can be performed in an arbitrary order, unless otherwise provided in the claims.

The foregoing description, for purposes of explanation, uses specific nomenclature to provide a thorough understanding of the invention. However, it will be apparent to one skilled in the art that specific details are not required in order to practice the invention. In fact, this description should not be read to limit any feature or aspect of the present invention to any embodiment; rather features and aspects of one embodiment can readily be interchanged with other embodiments. Notably, not every benefit described herein need be realized by each embodiment of the present invention; rather any specific embodiment can provide one or more of the advantages discussed above. In the claims, elements and/or operations do not imply any particular order of operation, unless explicitly stated in the claims. It is intended that the following claims and their equivalents define the scope of the invention.

What is claimed is:

1. A memory device, comprising:
   a resistive memory array including a plurality of word lines, a plurality of bit lines, and a plurality of resistive memory cells, each memory cell addressable by one of the word lines and one of the bit lines, each resistive memory cell configured to operate in association with a parameter; and
   a data signal adjuster configured to modify an operating characteristic of the resistive memory cell to compensate for a deviation from a target value for the operating characteristic based on the parameter;
   wherein the resistive memory cell is configured to generate a data signal having a magnitude substantially at the target value independent of variation in the parameter.

2. The memory device as set forth in claim 1, wherein the operating characteristic comprises a read current.

3. The memory device as set forth in claim 2, further comprising:
   a tracking array addressed separately from the resistive memory array and disposed in a layer of memory that includes the resistive memory cells;
   wherein the data signal adjuster is configured to adjust a value of the read current as a function of an amount of current passing through the tracking array.

4. The memory device as set forth in claim 3, further comprising:
   a reference array addressed separately from the resistive memory array and disposed in the layer of memory and configured to generate a reference current that tracks variation of the parameter.

5. The memory device as set forth in claim 4,
   wherein the tracking array comprises tracking cells;
   wherein the reference array comprises reference cells; and
   wherein the tracking cells, the reference cells, and the resistive memory cells comprise:
      discrete two-terminal non-volatile memory elements including an electrolytic insulator having a thickness less than 50 Angstroms; and
      at least one layer of a conductive metal oxide in contact with the electrolytic insulator, the conductive metal oxide including mobile oxygen ions.

6. The integrated circuit of claim 5, wherein the electrolytic insulator further comprises an electronically insulating electrolytic tunnel barrier layer configured for electron tunneling during data operations and to be permeable to the mobile oxygen ions during write operations, the electronically insulating electrolytic tunnel barrier layer including a material selected from the group consisting of a high-k dielectric material, rare earth oxides, rare earth metal oxides, yttria-stabilized zirconium, zirconia, yttrium oxide, erbium oxide, gadolinium oxide, lanthanum aluminum oxide, and hafnium oxide.

7. The memory device as set forth in claim 3, further comprising:
   other tracking arrays addressed separately from the resistive memory array and disposed in other layers of memory;
   wherein two or more of the layers of memory and the other layers of memory have different structures formed at different times, the different structures arising from variations in semiconductor processing, each tracking array selectable in conjunction with addressing of at least one memory cell on the same memory layer as that tracking array.

8. The memory device as set forth in claim 3, wherein the tracking array is configured to generate a tracking current having a magnitude indicative of a deviation of the magnitude of the operating characteristic from the target value for the resistive memory cell.

9. The memory device as set forth in claim 3, wherein the tracking array comprises an array of discrete two-terminal non-volatile memory elements having a non-linear current-to-voltage (IN) relationship shared with the resistive memory cell.

10. The memory device as set forth in claim 1, further comprising:
a parametric compensator configured to generate a read voltage reference.

11. The memory device as set forth in claim 10, further comprising:
an access signal generator configured to generate an access read voltage as a function of the read voltage reference.

12. The memory device as set forth in claim 11, further comprising:
a voltage adder configured to add an amount of voltage to a value of the read voltage reference.

13. The memory device as set forth in claim 12, further comprising:
a trim adjuster configured to generate the amount of voltage as a function of a trim control signal.

14. The memory device as set forth in claim 13, wherein the trim adjuster is configured to determine the amount of voltage for a read operation, a program verify operation, or an erase verify operation.

15. The memory device as set forth in claim 1, wherein the parameter comprises temperature or a structural attribute.

16. An integrated circuit including vertically configured non-Flash re-writeable non-volatile memory, comprising:
a semiconductor substrate;
a logic layer including circuitry fabricated front-end-of-the-line (FEOL) on the semiconductor substrate;
a back-end-of-the-line (BEOL) memory array comprising at least one memory layer fabricated directly above the semiconductor substrate and positioned above the logic layer, the BEOL memory array comprising a plurality of discrete two-terminal non-volatile memory elements electrically coupled with the circuitry and addressable via a plurality of first conductive lines arranged in a first direction and a plurality of second conductive lines arranged in a second direction;
an addressable BEOL tracking array disposed in the at least one memory layer, the BEOL tracking array configured to generate a tracking current; and
a data signal adjuster included in the circuitry and configured to modify a data operation current for one or more selected two-terminal non-volatile memory elements in the BEOL memory array to compensate for a deviation from a target current value for the data operation current due to a parameter;
wherein the memory element is configured to generate a data operation signal as a function of the tracking current, the data operation signal having a magnitude substantially at the target current value independent of variation in the parameter.

17. The integrated circuit of claim 16, further comprising:
a BEOL reference array disposed in the at least one memory layer and configured to generate a reference current as a function of the tracking current.

18. The integrated circuit of claim 16,
wherein the data operation current comprises a read current or a write current; and
wherein the data operation signal comprises a read signal or a write signal, respectively.

19. The integrated circuit of claim 18,
wherein the write current occurs during a write operation to one or more of the plurality of discrete two-terminal non-volatile memory elements in the BEOL memory array; and
wherein the write operation does not require a selected one of a prior erase operation or a prior block erase operation.

20. The integrated circuit of claim 16, further comprising:
a plurality of the BEOL memory arrays that are in contact with one another and are vertically stacked over the FEOL semiconductor substrate.

* * * * *